United States Patent
Iwamoto

(10) Patent No.: US 12,388,410 B2
(45) Date of Patent: Aug. 12, 2025

(54) ACOUSTIC WAVE DEVICE

(71) Applicant: Murata Manufacturing Co., Ltd., Nagaokakyo (JP)

(72) Inventor: Hideki Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 376 days.

(21) Appl. No.: 17/894,215

(22) Filed: Aug. 24, 2022

(65) Prior Publication Data

US 2022/0407497 A1 Dec. 22, 2022

Related U.S. Application Data

(63) Continuation of application No. PCT/JP2021/008116, filed on Mar. 3, 2021.

(30) Foreign Application Priority Data

Mar. 3, 2020 (JP) ................. 2020-036292

(51) Int. Cl.
  *H03H 9/02* (2006.01)
  *H03H 9/25* (2006.01)

(52) U.S. Cl.
  CPC .... *H03H 9/02228* (2013.01); *H03H 9/02015* (2013.01); *H03H 9/02157* (2013.01); *H03H 9/25* (2013.01)

(58) Field of Classification Search
  CPC .. H03H 9/02; H03H 9/02228; H03H 9/02535; H03H 9/17
  See application file for complete search history.

(56) References Cited

U.S. PATENT DOCUMENTS

| | | | | |
|---|---|---|---|---|
| 5,998,907 A | * | 12/1999 | Taguchi | H03H 9/02921 310/357 |
| 9,000,867 B2 | * | 4/2015 | Shimizu | H03H 9/02574 333/193 |
| 9,148,107 B2 | * | 9/2015 | Ueda | H03H 3/02 |
| 10,397,708 B2 | * | 8/2019 | Umeda | H04R 17/02 |

(Continued)

FOREIGN PATENT DOCUMENTS

| JP | 2002009584 A | 1/2002 |
|---|---|---|
| WO | 2012086639 A1 | 6/2012 |

(Continued)

OTHER PUBLICATIONS

International Search Report in PCT/JP2021/008116, mailed Apr. 13, 2021, 3 pages.

(Continued)

*Primary Examiner* — Andrea Lindgren Baltzell
*Assistant Examiner* — Alan Wong
(74) *Attorney, Agent, or Firm* — Keating & Bennett, LLP

(57) ABSTRACT

An acoustic wave device includes a support substrate, first and second piezoelectric layers, and an IDT electrode. The first and second piezoelectric layers are on the support substrate. The IDT electrode is on the first piezoelectric layer and includes electrode fingers. The second piezoelectric layer is between the first piezoelectric layer and the support substrate. The first and second piezoelectric layers are made of lithium tantalate or lithium niobate. Euler angles of the second piezoelectric layer are different from Euler angles of the first piezoelectric layer.

13 Claims, 16 Drawing Sheets

(56) References Cited

U.S. PATENT DOCUMENTS

| | | | |
|---|---|---|---|
| 12,028,044 B2 * | 7/2024 | Garcia | H03H 3/02 |
| 12,267,065 B2 * | 4/2025 | Liu | H03F 3/19 |
| 2013/0285768 A1 | 10/2013 | Watanabe et al. | |
| 2018/0159497 A1 | 6/2018 | Iwamoto et al. | |

FOREIGN PATENT DOCUMENTS

| | | |
|---|---|---|
| WO | 2013031651 A1 | 3/2013 |
| WO | 2017043427 A1 | 3/2017 |

OTHER PUBLICATIONS

Written Opinion in PCT/JP2021/008116, mailed Apr. 13, 2021, 5 pages.

* cited by examiner

ACOUSTIC WAVE DEVICE

CROSS REFERENCE TO RELATED APPLICATIONS

This application claims the benefit of priority to Japanese Patent Application No. 2020-036292 filed on Mar. 3, 2020 and is a Continuation Application of PCT Application No. PCT/JP2021/008116 filed on Mar. 3, 2021. The entire contents of each application are hereby incorporated herein by reference.

BACKGROUND OF THE INVENTION

1. Field of the Invention

The present invention relates to acoustic wave devices, and more particularly, to an acoustic wave device including an interdigital transducer (IDT) electrode.

2. Description of the Related Art

International Publication No. 2012/086639 describes an existing acoustic wave device. The acoustic wave device described in International Publication No. 2012/086639 includes a high acoustic velocity support substrate (support substrate), a piezoelectric film (piezoelectric layer), and an IDT electrode. In the acoustic wave device described in International Publication No. 2012/086639, the IDT electrode is formed on one surface of the piezoelectric film.

The existing acoustic wave device described in International Publication No. 2012/086639 has a problem in that a spurious response of a Rayleigh mode may occur in a band on the lower frequency side than an excitation mode used for obtaining characteristics, and a spurious response of a higher-order mode may occur in a band on the higher frequency side than the above excitation mode. As such, the characteristics of the device may be deteriorated.

SUMMARY OF THE INVENTION

Preferred embodiments of the present invention provide acoustic wave devices that are each able to reduce or prevent a spurious response of a Rayleigh mode that occurs in a band on a lower frequency side than an excitation mode used to obtain characteristics and a spurious response of a higher-order mode that occurs in a band on a higher frequency side than the excitation mode.

An acoustic wave device according to a preferred embodiment of the present invention includes a support substrate, a first piezoelectric layer and a second piezoelectric layer, and an IDT electrode. The first piezoelectric layer and the second piezoelectric layer are on the support substrate. The IDT electrode is on the first piezoelectric layer and includes a plurality of electrode fingers. The second piezoelectric layer is between the first piezoelectric layer and the support substrate. Both of the first piezoelectric layer and the second piezoelectric layer are made of lithium tantalate or lithium niobate. Euler angles of the second piezoelectric layer are different from Euler angles of the first piezoelectric layer.

With the acoustic wave devices according to preferred embodiments of the present invention, it is possible to reduce or prevent the spurious response of the Rayleigh mode that occurs in a band on the lower frequency side than an excitation mode used to obtain characteristics and the spurious response of the higher-order mode that occurs in a band on the higher frequency side than the excitation mode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
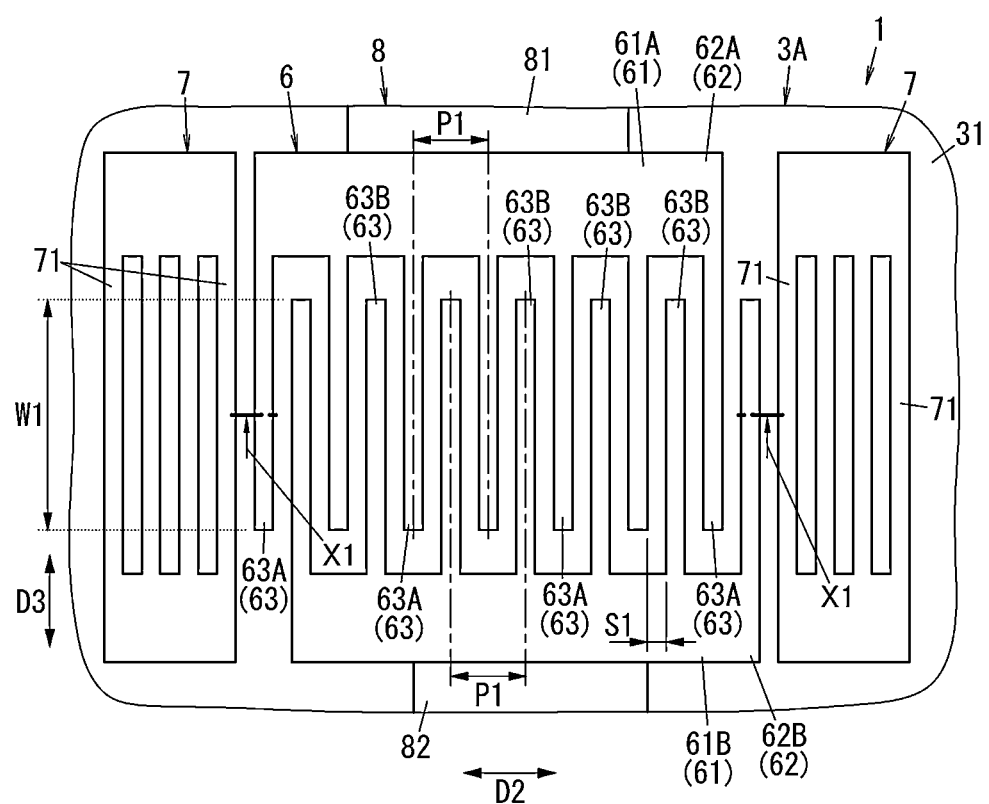
FIG. 1 is a front view of an acoustic wave device according to Preferred Embodiment 1 of the present invention.

Hereinafter, acoustic wave devices according to Preferred Embodiments 1 to 10 of the present invention will be described with reference to the drawings. FIGS. 1, 2, 5, 10, 12, and 18 to be referred to in the following preferred embodiments and the like are schematic views, and respective ratios of size and thickness of elements in the drawings do not necessarily reflect actual dimensional ratios.

Preferred Embodiment 1

(1) Acoustic Wave Device

An overall configuration of an acoustic wave device according to Preferred Embodiment 1 of the present invention will be described with reference to the drawings.

Figure 2:
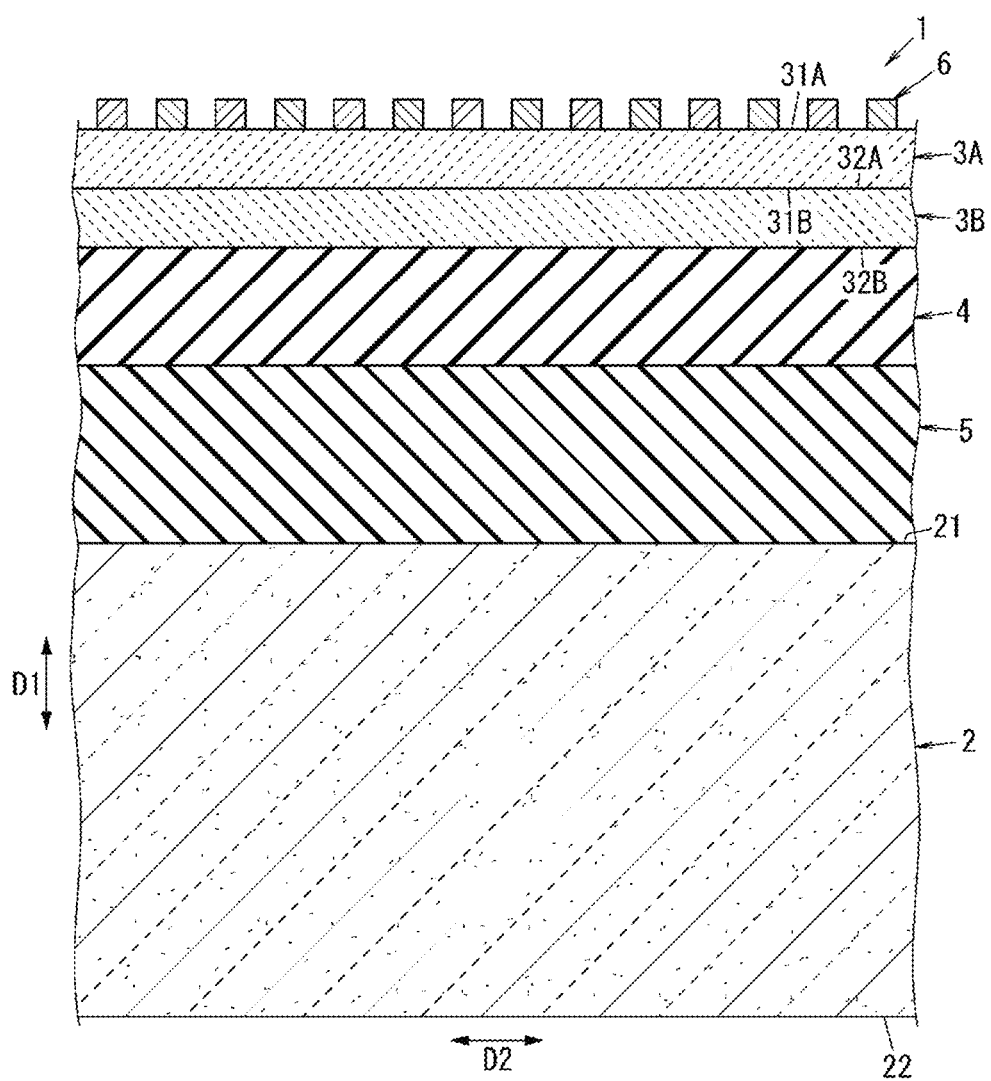
FIG. 2 is a cross-sectional view of the above acoustic wave device taken along a line X1-X1 in FIG. 1.

As illustrated in FIG. 1 and FIG. 2, an acoustic wave device 1 according to Preferred Embodiment 1 includes a support substrate 2, a first piezoelectric layer 3A, a second piezoelectric layer 3B, a low acoustic velocity film 4, a high acoustic velocity film 5, and an interdigital transducer (IDT) electrode 6. In addition, the acoustic wave device 1 further includes two reflectors 7, a wiring portion 8, and a protective film (not illustrated).

(2) Each Element of Acoustic Wave Device

Each element of the acoustic wave device 1 according to Preferred Embodiment 1 will be described below with reference to the drawings.
(2.1) Support Substrate As illustrated in FIG. 2, the support substrate 2 includes a first main surface 21 and a second main surface 22 that face each other. The first main surface 21 and the second main surface 22 face each other in a thickness direction (first direction D1) of the support substrate 2. The support substrate 2 has, for example, a rectangular or substantially rectangular shape in a plan view from the thickness direction (first direction D1) of the support substrate 2. The shape of the support substrate 2 is not limited to the rectangular or substantially rectangular shape, and may be, for example, a square or substantially square shape.

In the support substrate 2, the acoustic velocity of a bulk wave propagating through the support substrate 2 is higher than the acoustic velocity of an acoustic wave propagating through the first piezoelectric layer 3A and the second piezoelectric layer 3B. Here, the bulk wave propagating through the support substrate is a bulk wave having the lowest acoustic velocity among a plurality of bulk waves propagating through the support substrate 2.

The support substrate 2 is, for example, a silicon substrate. The thickness of the support substrate 2 is preferably, for example, equal to or more than about 10λ (λ: a wavelength of an acoustic wave determined by an electrode finger pitch P1 described later) and equal to or less than about 180 µm, and is, for example, about 120 µm. In a case where the support substrate 2 is a silicon substrate, a plane orientation of the first main surface 21 of the support substrate 2 is, for example, (100) plane, but is not limited thereto, and may be, for example, (110) plane, (111) plane, or the like. A propagation orientation of the acoustic wave can be set without being restricted by the plane orientation of the first main surface 21 of the support substrate 2.

The material of the support substrate 2 is not limited to silicon. The support substrate 2 may include, for example, at least one material selected from the group consisting of silicon, aluminum nitride, aluminum oxide, silicon carbide, silicon nitride, sapphire, lithium tantalate, lithium niobate, quartz, alumina, zirconia, cordierite, mullite, steatite, forsterite, magnesia, and diamond.
(2.2.1) First Piezoelectric Layer As illustrated in FIG. 2, the first piezoelectric layer 3A is provided on the support substrate 2 via the second piezoelectric layer 3B. More specifically, the first piezoelectric layer 3A is provided on the first main surface 21 side of the support substrate 2 with the second piezoelectric layer 3B, the low acoustic velocity film 4, and the high acoustic velocity film 5 interposed therebetween in the thickness direction (first direction D1) of the support substrate 2. The first piezoelectric layer 3A includes a first main surface 31A and a second main surface 32A. The first main surface 31A and the second main surface 32A face each other in the thickness direction (first direction D1) of the support substrate 2.

The first piezoelectric layer 3A is made of, for example, a Y-cut X-propagation LiTaO$_3$ piezoelectric single crystal. The Y-cut X-propagation LiTaO$_3$ piezoelectric single crystal is a LiTaO$_3$ single crystal, when three crystal axes of a LiTaO$_3$ piezoelectric single crystal are defined as an X-axis, a Y-axis, and a Z-axis, provided by cutting at a plane in which the Z-axis after having been rotated by θ1° about the X-axis as a central axis in a Z-axis direction from the Y-axis is a normal line, and is a single crystal through which the surface acoustic wave propagates in an X-axis direction. As for a cut angle of the first piezoelectric layer 3A, when the cut angle is represented by Γ1[°] and the Euler angles of the first piezoelectric layer 3A are represented by (φ1, θ1, ψ1), θ1=Γ1+90° is satisfied. However, Γ1 and Γ1±180×n are synonymous. Here, n is a natural number. The first piezoelectric layer 3A is not limited to the Y-cut X-propagation LiTaO$_3$ piezoelectric single crystal, and may be, for example, a Y-cut X-propagation LiTaO$_3$ piezoelectric ceramics.
(2.2.2) Second Piezoelectric Layer As illustrated in FIG. 2, the second piezoelectric layer 3B is provided on the support substrate 2. The phrase "the second piezoelectric layer 3B is provided on the support substrate 2" includes a case where the second piezoelectric layer 3B is directly provided on the support substrate 2 without another layer interposed therebetween and a case where the second piezoelectric layer 3B is indirectly provided on the support substrate 2 with another layer interposed therebetween.

In the example of FIG. 2, the second piezoelectric layer 3B is indirectly provided on the support substrate 2. More specifically, the second piezoelectric layer 3B is provided on the first main surface 21 side of the support substrate 2 with the low acoustic velocity film 4 and the high acoustic velocity film 5 interposed therebetween in the thickness direction (first direction D1) of the support substrate 2. The second piezoelectric layer 3B includes a first main surface 31B and a second main surface 32B. The first main surface 31B and the second main surface 32B face each other in the thickness direction (first direction D1) of the support substrate 2.

The second piezoelectric layer 3B is made of, for example, a Y-cut X-propagation $LiTaO_3$ piezoelectric single crystal. The Y-cut X-propagation $LiTaO_3$ piezoelectric single crystal is a $LiTaO_3$ single crystal, when three crystal axes of a $LiTaO_3$ piezoelectric single crystal are defined as an X-axis, a Y-axis, and a Z-axis, provided by cutting at a plane in which an axis rotated by 02° about the X-axis as a central axis in a Z-axis direction from the Y-axis is a normal line, and is a single crystal through which the surface acoustic wave propagates in an X-axis direction. As for the cut angle of the second piezoelectric layer 3B, when the cut angle is represented by Γ2[°] and the Euler angles of the second piezoelectric layer 3B are represented by (φ2, θ2, ψ2), θ2=Γ2+90° is satisfied. However, Γ2 and Γ2±180×n are synonymous. Here, n is a natural number. The second piezoelectric layer 3B is not limited to the Y-cut X-propagation $LiTaO_3$ piezoelectric single crystal, and may be, for example, a Y-cut X-propagation $LiTaO_3$ piezoelectric ceramics.

(2.3.1) Total Film Thickness of First Piezoelectric Layer and Second Piezoelectric Layer The total film thickness of the first piezoelectric layer 3A and the second piezoelectric layer 3B is, for example, equal to or less than about 3.5λ, when λ is the wavelength of the acoustic wave determined by the electrode finger pitch P1 of the IDT electrode 6 (see FIG. 1). When the total film thickness of the first piezoelectric layer 3A and the second piezoelectric layer 3B is less than or equal to or less than about 3.5λ, a Q factor of the acoustic wave device 1 increases. In addition, by setting the total film thickness of the first piezoelectric layer 3A and the second piezoelectric layer 3B to, for example, equal to or less than about 2.5λ, a temperature coefficient of frequency (TCF) can be reduced. Further, by setting the total film thickness of the first piezoelectric layer 3A and the second piezoelectric layer 3B to, for example, equal to or less than about 1.5λ, the acoustic velocity of the acoustic wave can be easily adjusted. For example, when the wavelength λ of the acoustic wave is about 2 μm, the total film thickness of the first piezoelectric layer 3A and the second piezoelectric layer 3B is about 0.1λ (200 nm). The total film thickness of the first piezoelectric layer 3A and the second piezoelectric layer 3B is not limited to equal to or less than about 3.5λ, and may be greater than about 3.5λ.

In a case where the total film thickness of the first piezoelectric layer 3A and the second piezoelectric layer 3B is equal to or less than about 3.5λ, the Q factor increases as described above, but a higher-order mode occurs. In the acoustic wave device 1, even when the total film thickness of the first piezoelectric layer 3A and the second piezoelectric layer 3B is equal to or less than about 3.5λ, the low acoustic velocity film 4 and the high acoustic velocity film 5 are provided so as to reduce the higher-order mode.

(2.3.2) Mode of Acoustic Wave Propagating in First Piezoelectric Layer and Second Piezoelectric Layer In the acoustic wave device 1, as a mode of an acoustic wave propagating through the first piezoelectric layer 3A, there is a longitudinal wave, an SH wave, or an SV wave, or a mode in which these waves are combined. In the acoustic wave device 1, a mode in which an SH wave is a main component is used as a main mode. The higher-order mode refers to a spurious mode that occurs on a higher frequency side than the main mode of the acoustic wave propagating through the first piezoelectric layer 3A. Whether or not the mode of the acoustic wave propagating through the first piezoelectric layer 3A is the "main mode in which the SH wave is the main component" can be confirmed by analyzing the displacement distribution by a finite element method and analyzing distortion, using parameters such as the parameters of the first piezoelectric layer 3A (for example, material, Euler angles, thickness, and the like), the parameters of the IDT electrode 6 (for example, material, thickness, electrode finger pitch P1, and the like), the parameters of the low acoustic velocity film 4 (for example, material, thickness, and the like), the parameters of the high acoustic velocity film 5 (for example, material, thickness, and the like) and the like. The Euler angles of the first piezoelectric layer 3A can be obtained by analysis.

In the acoustic wave device 1, as a mode of an acoustic wave propagating through the second piezoelectric layer 3B, there is a longitudinal wave, an SH wave, or an SV wave, or a mode in which these waves are combined. In the acoustic wave device 1, a mode in which the SH wave is the main component is used as the main mode. The higher-order mode refers to a spurious mode that occurs on a higher frequency side than the main mode of the acoustic wave propagating through the second piezoelectric layer 3B. Whether or not the mode of the acoustic wave propagating through the second piezoelectric layer 3B is the "main mode in which the SH wave is the main component" can be confirmed by analyzing the displacement distribution by a finite element method and analyzing distortion, using parameters such as the parameters of the second piezoelectric layer 3B (for example, material, Euler angles, thickness, and the like), the parameters of the IDT electrode 6 (for example, material, thickness, electrode finger pitch P1, and the like), the parameters of the low acoustic velocity film 4 (for example, material, thickness, and the like), the parameters of the high acoustic velocity film 5 (for example, material, thickness, and the like) and the like. The Euler angles of the second piezoelectric layer 3B can be obtained by analysis.

The acoustic wave device 1 is not limited to using the mode in which the SH wave is the main component as the main mode in both the first piezoelectric layer 3A and the second piezoelectric layer 3B. Of the first piezoelectric layer 3A and the second piezoelectric layer 3B, a mode in which the SH wave is the main component may be used as the main mode only in the first piezoelectric layer 3A, or a mode in which the SH wave is the main component may be used as the main mode only in the second piezoelectric layer 3B. In short, in at least one of the first piezoelectric layer 3A and the second piezoelectric layer 3B, a mode in which the SH wave is the main component may be used as the main mode.

(2.4) Low Acoustic Velocity Film

As illustrated in FIG. 2, the low acoustic velocity film 4 is provided on the support substrate 2. The phrase "the low acoustic velocity film 4 is provided on the support substrate 2" includes a case where the low acoustic velocity film 4 is directly provided on the support substrate 2 without another layer interposed therebetween and a case where the low acoustic velocity film 4 is indirectly provided on the support substrate 2 with another layer interposed therebetween.

In the example of FIG. 2, the low acoustic velocity film is provided between the support substrate 2 and the second piezoelectric layer 3B in the thickness direction (first direction D1) of the support substrate 2. More specifically, the low acoustic velocity film 4 is provided on the first main surface 21 side of the support substrate 2 with the high acoustic velocity film 5 interposed therebetween. The low acoustic velocity film 4 is a film in which the acoustic velocity of a bulk wave propagating through the low acoustic velocity film 4 is lower than the acoustic velocity of a bulk wave propagating through the first piezoelectric layer 3A and the second piezoelectric layer 3B.

Since the low acoustic velocity film 4 is provided between the support substrate 2 and the second piezoelectric layer 3B, the acoustic velocity of the acoustic wave is reduced. The acoustic wave inherently has a property that energy is concentrated in a medium having a low acoustic velocity. Therefore, it is possible to increase the effect of confining the energy of the acoustic wave in the second piezoelectric layer 3B and the IDT electrode 6 in which the acoustic wave is excited. As a result, the loss can be reduced and the Q factor of the acoustic wave device 1 can be increased, as compared to a case where the low acoustic velocity film 4 is not provided.

The material of the low acoustic velocity film 4 is, for example, silicon oxide. Note that the material of the low acoustic velocity film 4 is not limited to silicon oxide, and may be, for example, glass, silicon oxynitride, tantalum oxide, a compound obtained by adding fluorine, carbon, or boron to silicon oxide, or a material including each of the above materials as a main component.

In a case where the low acoustic velocity film 4 is silicon oxide, temperature characteristics can be improved. The elastic constant of lithium tantalate has a negative temperature characteristic, and the elastic constant of silicon oxide has a positive temperature characteristic. Therefore, in the acoustic wave device 1, the absolute value of the TCF can be reduced.

The thickness of the low acoustic velocity film 4 is preferably, for example, equal to or less than about 2.0λ, when λ is the wavelength of the acoustic wave determined by the electrode finger pitch P1. For example, in a case where the wavelength λ of the acoustic wave is about 2 μm, the thickness of the low acoustic velocity film 4 is about 0.2λ (400 nm). By setting the thickness of the low acoustic velocity film 4 to equal to or less than about 2.0λ, the film stress can be reduced, as a result, it is possible to reduce warpage of a silicon wafer from which the support substrate 2 is formed at the time of manufacture of the acoustic wave device 1, and it is possible to improve the yield and stabilize the characteristics.

In addition, the acoustic wave device 1 may include, for example, an adhesion layer interposed between the low acoustic velocity film 4 and the second piezoelectric layer 3B. With this, it is possible to improve adhesion property between the low acoustic velocity film 4 and the second piezoelectric layer 3B. The adhesion layer is made of, for example, resin (epoxy resin, polyimide resin, or the like), a metal, or the like. In addition, the acoustic wave device 1 may include not only the adhesion layer but also a dielectric film between the low acoustic velocity film and the second piezoelectric layer 3B, on the second piezoelectric layer 3B, or under the low acoustic velocity film 4.

(2.5) High Acoustic Velocity Film

As illustrated in FIG. 2, the high acoustic velocity film 5 is provided on the support substrate 2. The phrase "the high acoustic velocity film 5 is provided on the support substrate 2" includes a case where the high acoustic velocity film 5 is directly provided on the support substrate 2 without another layer interposed therebetween and a case where the high acoustic velocity film 5 is indirectly provided on the support substrate 2 with another layer interposed therebetween.

In the example illustrated in FIG. 2, the high acoustic velocity film 5 is provided between the support substrate 2 and the low acoustic velocity film 4 in the thickness direction (first direction D1) of the support substrate 2. More specifically, the high acoustic velocity film 5 is provided on the first main surface 21 side of the support substrate 2. The high acoustic velocity film 5 is a film in which the acoustic velocity of a bulk wave propagating through the high acoustic velocity film 5 is higher than the acoustic velocity of an acoustic wave propagating through the first piezoelectric layer 3A and the second piezoelectric layer 3B.

The thickness of the high acoustic velocity film 5 is, for example, about 200 nm, about 300 nm, about 400 nm, and about 600 nm. For example, in a case where the wavelength λ of the acoustic wave is about 2 μm, the thickness of the high acoustic velocity film 5 is about 0.3λ (600 nm). As for the thickness of the high acoustic velocity film 5, the high acoustic velocity film 5 is preferably as thick as possible because the high acoustic velocity film 5 confines the acoustic wave in the first piezoelectric layer 3A, the second piezoelectric layer 3B, and the low acoustic velocity film 4.

The high acoustic velocity film 5 reduces or prevents leakage of the energy of the acoustic wave of the main mode to a structure below the high acoustic velocity film 5. In the acoustic wave device 1, in a case where the high acoustic velocity film 5 is sufficiently thick, the energy of the acoustic wave of the main mode is distributed throughout the first piezoelectric layer 3A, the second piezoelectric layer 3B, and the low acoustic velocity film 4, is also distributed in a portion of the high acoustic velocity film 5 on the low acoustic velocity film 4 side, and is not distributed in the support substrate 2. The mechanism of confining the acoustic wave by the high acoustic velocity film 5 is the same or substantially the same as that in the case of a Love wave surface wave which is a non-leaky SH wave, and is described in, for example, "Introduction to Simulation Technologies for Surface Acoustic Wave Devices", Kenya Hashimoto, REALIZE Science & Engineering, pp. 26-28. The mechanism described above is different from a mechanism in which an acoustic wave is confined using a Bragg reflector based on an acoustic multilayer film.

The material of the high acoustic velocity film 5 is, for example, silicon nitride. The material of the high acoustic velocity film 5 is not limited to silicon nitride, and may be, for example, at least one material selected from the group consisting of diamond-like carbon, aluminum nitride, aluminum oxide, silicon carbide, silicon, sapphire, a piezoelectric body (lithium tantalate, lithium niobate, or crystal), alumina, zirconia, cordierite, mullite, steatite, forsterite, magnesia, and diamond. The material of the high acoustic velocity film 5 may be a material in which any one of the above-described materials is a main component or a material in which a mixture including any one of the above-described materials is the main component.

(2.6) IDT Electrode

As illustrated in FIG. 1 and FIG. 2, the IDT electrode is provided on the first piezoelectric layer 3A. More specifically, the IDT electrode 6 is provided on the first main surface 31A of the first piezoelectric layer 3A in the thickness direction (first direction D1) of the support substrate 2.

As illustrated in FIG. 1, the IDT electrode 6 includes two electrodes 61. In other words, the IDT electrode 6 includes two busbars 62 and two sets of electrode fingers 63. More specifically, the IDT electrode 6 includes a first electrode 61A and a second electrode 61B. Each of the first electrode 61A and the second electrode 61B has conductivity. The first electrode 61A and the second electrode 61B are spaced apart from each other and electrically insulated from each other.

The first electrode 61A has a comb shape in a plan view from the thickness direction (first direction D1) of the support substrate 2. The first electrode 61A includes a first busbar 62A and a plurality of first electrode fingers 63A. The first busbar 62A is a conductive portion making the plurality of first electrode fingers 63A have the same potential (equipotential).

The second electrodes 61B have a comb shape in a plan view from the thickness direction (first direction D1) of the support substrate 2. The second electrode 61B includes a second busbar 62B and a plurality of second electrode fingers 63B. The second busbar 62B is a conductive portion making the plurality of second electrode fingers 63B have the same potential (equipotential). In the IDT electrode 6, the first busbar 62A and the second busbar 62B face each other in a third direction D3.

The plurality of first electrode fingers 63A are connected to the first busbar 62A and extend toward the second busbar 62B side. The plurality of first electrode fingers 63A are integral with the first busbar 62A and are spaced apart from the second busbar 62B.

The plurality of second electrode fingers 63B are connected to the second busbar 62B and extend toward the first busbar 62A side. The plurality of second electrode fingers 63B are integral with the second busbar 62B and are spaced apart from the first busbar 62A.

The IDT electrode 6 is, for example, a normal IDT electrode. Hereinafter, the IDT electrode 6 will be described in more detail.

The first busbar 62A and the second busbar 62B of the IDT electrode 6 each have an elongated shape with a longitudinal direction in a second direction D2. In the IDT electrode 6, the first busbar 62A and the second busbar 62B face each other in the third direction D3. The second direction D2 is a direction orthogonal or substantially orthogonal to the thickness direction (first direction D1) of the support substrate 2. The third direction D3 is a direction orthogonal or substantially orthogonal to both the thickness direction of the support substrate 2 (first direction D1) and the second direction D2.

The plurality of first electrode fingers 63A are connected to the first busbar 62A and extend toward the second busbar 62B. Here, the plurality of first electrode fingers 63A extend from the first busbar 62A along the third direction D3. Tips of the plurality of first electrode fingers 63A are spaced apart from the second busbar 62B. For example, the lengths of the plurality of first electrode fingers 63A are the same or substantially the same.

The plurality of second electrode fingers 63B are connected to the second busbar 62B and extend toward the first busbar 62A. Here, the plurality of second electrode fingers 63B extend from the second busbar 62B along the third direction D3. Tips of the plurality of second electrode fingers 63B are spaced apart from the first busbar 62A. For example, the lengths of the plurality of second electrode fingers 63B are the same or substantially the same. In the example of FIG. 1, the lengths of the plurality of second electrode fingers 63B are the same or substantially the same as the lengths of the plurality of first electrode fingers 63A.

In the IDT electrode 6, the plurality of first electrode fingers 63A and the plurality of second electrode fingers 63B are alternately arranged one by one in the second direction D2 to be spaced apart from each other. Therefore, the first electrode finger 63A and the second electrode finger 63B adjacent to each other are spaced apart from each other by a distance S1. A group of electrode fingers 63 including the plurality of first electrode fingers 63A and the plurality of second electrode fingers 63B only needs to have a configuration in which the plurality of first electrode fingers 63A and the plurality of second electrode fingers 63B are arranged to be spaced apart from each other in the second direction D2, and may have a configuration in which the plurality of first electrode fingers 63A and the plurality of second electrode fingers 63B are not arranged alternately to be spaced apart from each other. For example, a region in which the first electrode fingers 63A and the second electrode fingers 63B are arranged one by one to be spaced apart from each other and a region in which two first electrode fingers 63A or two second electrode fingers 63B are arranged in the second direction D2 may be mixed.

The plurality of first electrode fingers 63A and the plurality of second electrode fingers 63B are interdigitated with each other. The length of the overlap between the first electrode finger 63A and the second electrode finger 63B when viewed in an acoustic wave propagation direction is referred to as an overlap width W1. In other words, the IDT electrode 6 includes an overlap region defined by the plurality of first electrode fingers 63A and the plurality of second electrode fingers 63B. The overlap region is between the envelope of the tips of the plurality of first electrode fingers 63A and the envelope of the tips of the plurality of second electrode fingers 63B. The IDT electrode 6 excites the acoustic wave in the first piezoelectric layer 3A and the second piezoelectric layer 3B in the overlap region.

The IDT electrode 6 is not limited to a normal IDT electrode, and may be, for example, an apodization weighted IDT electrode or an inclined IDT electrode. In the apodization weighted IDT electrode, the overlap width increases approaching from one end portion toward the center in the propagation direction of the acoustic wave, and the overlap width decreases approaching from the center toward the other end portion in the propagation direction of the acoustic wave.

As illustrated in FIG. 1, the electrode finger pitch P1 of the IDT electrode 6 is defined by a distance between centerlines of two adjacent first electrode fingers 63A among the plurality of first electrode fingers 63A or a distance between centerlines of two adjacent second electrode fingers 63B among the plurality of second electrode fingers 63B. The distance between the centerlines of two adjacent second electrode fingers 63B is the same as the distance between the centerlines of two adjacent first electrode fingers 63A.

In the IDT electrode 6 of the acoustic wave device 1 according to Preferred Embodiment 1, the number of pairs of the first electrode fingers 63A and the second electrode fingers 63B is, for example, 100. In other words, the IDT electrode 6 includes, for example, 100 first electrode fingers 63A and 100 second electrode fingers 63B.

The material of the IDT electrode 6 is an appropriate metal material such as, for example, aluminum (Al), copper (Cu), platinum (Pt), gold (Au), silver (Ag), titanium (Ti), nickel (Ni), chromium (Cr), molybdenum (Mo), tungsten (W) or the like, or an alloy mainly including any one of these metals or the like. Further, the IDT electrode 6 may have a structure in which a plurality of metal films made of these metals or alloys are laminated.

(2.7) Reflector

As illustrated in FIG. 1, the two reflectors 7 are provided on the first piezoelectric layer 3A. More specifically, the two reflectors 7 are provided on the first main surface 31A of the first piezoelectric layer 3A in the thickness direction (first direction D1) of the support substrate 2. Each of the two reflectors 7 is electrically conductive.

The two reflectors 7 are respectively positioned on one side and the other side of the IDT electrode 6 one by one in the direction (second direction D2) along the propagation direction of the acoustic wave of the acoustic wave device 1. In other words, the IDT electrode 6 is positioned between the two reflectors 7 in the second direction D2. Each reflector 7 is, for example, a short-circuit grating. Each reflector 7 reflects the acoustic wave.

Each of the two reflectors 7 includes a plurality of electrode fingers 71, one ends of the plurality of electrode fingers 71 being short-circuited, and the other ends thereof being short-circuited. In each of the two reflectors 7, the number of electrode fingers is, for example, 20.

The material of each reflector 7 is an appropriate metal material such as, for example, aluminum (Al), copper (Cu), platinum (Pt), gold (Au), silver (Ag), titanium (Ti), nickel (Ni), chromium (Cr), molybdenum (Mo), tungsten (W) or the like, or an alloy mainly including any one of these metals or the like. Further, each reflector 7 may have a structure in which a plurality of metal films made of these metals or alloys are laminated.

In the acoustic wave device 1, in a case where each reflector 7 and the IDT electrode 6 are made of the same material and have the same or substantially the same thickness, each reflector 7 and the IDT electrode 6 can be formed in the same process when manufacturing the acoustic wave device 1.

In the acoustic wave device 1 according to the present preferred embodiment, each reflector 7 is a short-circuit grating, but each reflector 7 is not limited to the short-circuit grating, and may be, for example, an open grating, a positive-negative reflective grating, or a grating in which a short-circuit grating and an open grating are combined.

(2.8) Wiring Portion

As illustrated in FIG. 1, the wiring portion 8 is provided on the first piezoelectric layer 3A. More specifically, the wiring portion 8 is provided on the first main surface 31A of the first piezoelectric layer 3A in the thickness direction (first direction D1) of the support substrate 2. The wiring portion 8 has conductivity.

The wiring portion 8 includes a first wiring portion 81 and a second wiring portion 82. The first wiring portion 81 is connected to the first busbar 62A of the IDT electrode 6. The second wiring portion 82 is connected to the second busbar 62B of the IDT electrode 6. The first wiring portion 81 and the second wiring portion 82 are spaced apart from each other and electrically insulated from each other.

The first wiring portion 81 extends from the first busbar 62A to the side opposite to the plurality of first electrode fingers 63A side. The first wiring portion 81 may be formed so as to partially overlap the first busbar 62A in the thickness direction (first direction D1) of the support substrate 2, or may be formed integrally with the first busbar 62A with the same material and the same or substantially the same thickness as the first busbar 62A.

The second wiring portion 82 extends from the second busbar 62B to the side opposite to the plurality of second electrode fingers 63B side. The second wiring portion 82 may partially overlap the second busbar 62B in the thickness direction (first direction D1) of the support substrate 2, or may be integral with the second busbar 62B with the same material and the same or substantially the same thickness as the second busbar 62B.

The material of the wiring portion 8 is an appropriate metal material such as, for example, aluminum (Al), copper (Cu), platinum (Pt), gold (Au), silver (Ag), titanium (Ti), nickel (Ni), chromium (Cr), molybdenum (Mo), tungsten (W) or the like, or an alloy mainly including any one of these metals or the like. Further, the wiring portion 8 may have a structure in which a plurality of metal films made of these metals or alloys is laminated.

(2.9) Protective Film

A protective film (not illustrated) is provided on the first piezoelectric layer 3A. The protective film covers the IDT electrode 6, each of the reflectors 7, and the wiring portion 8 on the first main surface 31A of the first piezoelectric layer 3A, and a portion of the first main surface 31A of the first piezoelectric layer 3A.

The material of the protective film is, for example, silicon oxide. The material of a protective film is not limited to silicon oxide and may be, for example, silicon nitride. The protective film is not limited to a single-layer structure, and may have, for example, a multilayer structure including two or more layers.

(3) Characteristics of Acoustic Wave Device

Figure 3:
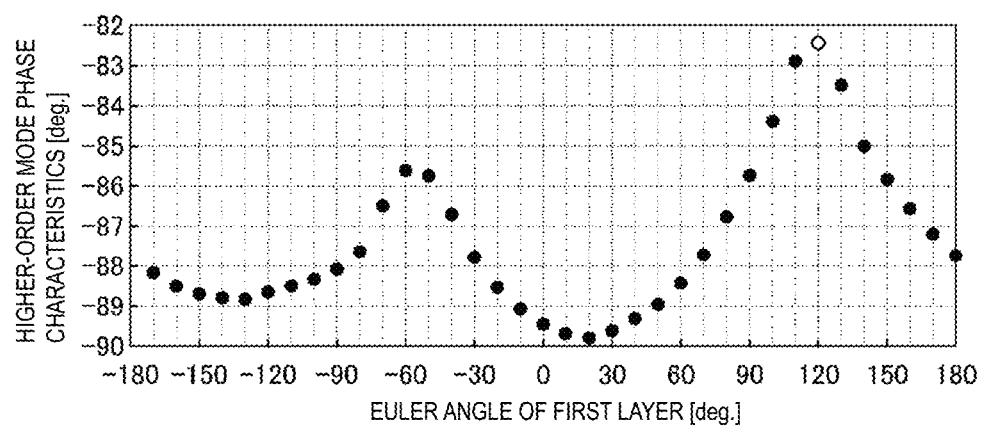
FIG. 3 is a graph illustrating higher-order mode phase characteristics of the acoustic wave device according to Preferred Embodiment 1 of the present invention.

Characteristics of the acoustic wave device 1 according to Preferred Embodiment 1 will be described below with reference to the drawings. In FIG. 3, an "Euler angle of a first layer" is a second Euler angle $\theta1$ of the Euler angles (0, $\theta1$, 0) of the first piezoelectric layer 3A.

In the acoustic wave device 1 according to Preferred Embodiment 1, as illustrated in FIG. 3, in a case where the Euler angles of the first piezoelectric layer 3A are different from the Euler angles of the second piezoelectric layer 3B, the higher-order mode phase characteristics can be improved, as compared to a case where the Euler angles of the first piezoelectric layer 3A are the same as the Euler angles of the second piezoelectric layer 3B. In the example of FIG. 3, assuming that the Euler angles of the first piezoelectric layer 3A are (0, $\theta1$, 0) and the Euler angles of the second piezoelectric layer 3B are (0, $\theta2$, 0), the case where the Euler angles of the first piezoelectric layer 3A are the same as the Euler angles of the second piezoelectric layer 3B is the case where the second Euler angles $\theta1$ and $\theta2$ are both about 120°.

Conditions of the acoustic wave device 1 to obtain the phase characteristics of FIG. 3 are, for example, as follows. The thickness of the IDT electrode 6 is about 0.05$\lambda$, the thickness of the first piezoelectric layer 3A is about 0.1$\lambda$, the thickness of the second piezoelectric layer 3B is about 0.1$\lambda$, the thickness of the low acoustic velocity film 4 is about 0.15$\lambda$, and the thickness of the high acoustic velocity film 5 is about 0.15$\lambda$. The material of the IDT electrode 6 is aluminum, the material of the first piezoelectric layer 3A and the second piezoelectric layer 3B is lithium tantalate, the material of the low acoustic velocity film 4 is silicon oxide, the material of the high acoustic velocity film 5 is silicon nitride, and the material of the support substrate 2 is silicon. Assuming that the Euler angles of the first piezoelectric layer 3A are (0, $\theta1$, 0) and the Euler angles of the second piezoelectric layer 3B are (0, $\theta2$, 0), the characteristics are obtained in the case where the second Euler angle $\theta1$ is changed from about −180° to about 180° when the second Euler angle $\theta2$ is about 120°.

Figure 18:
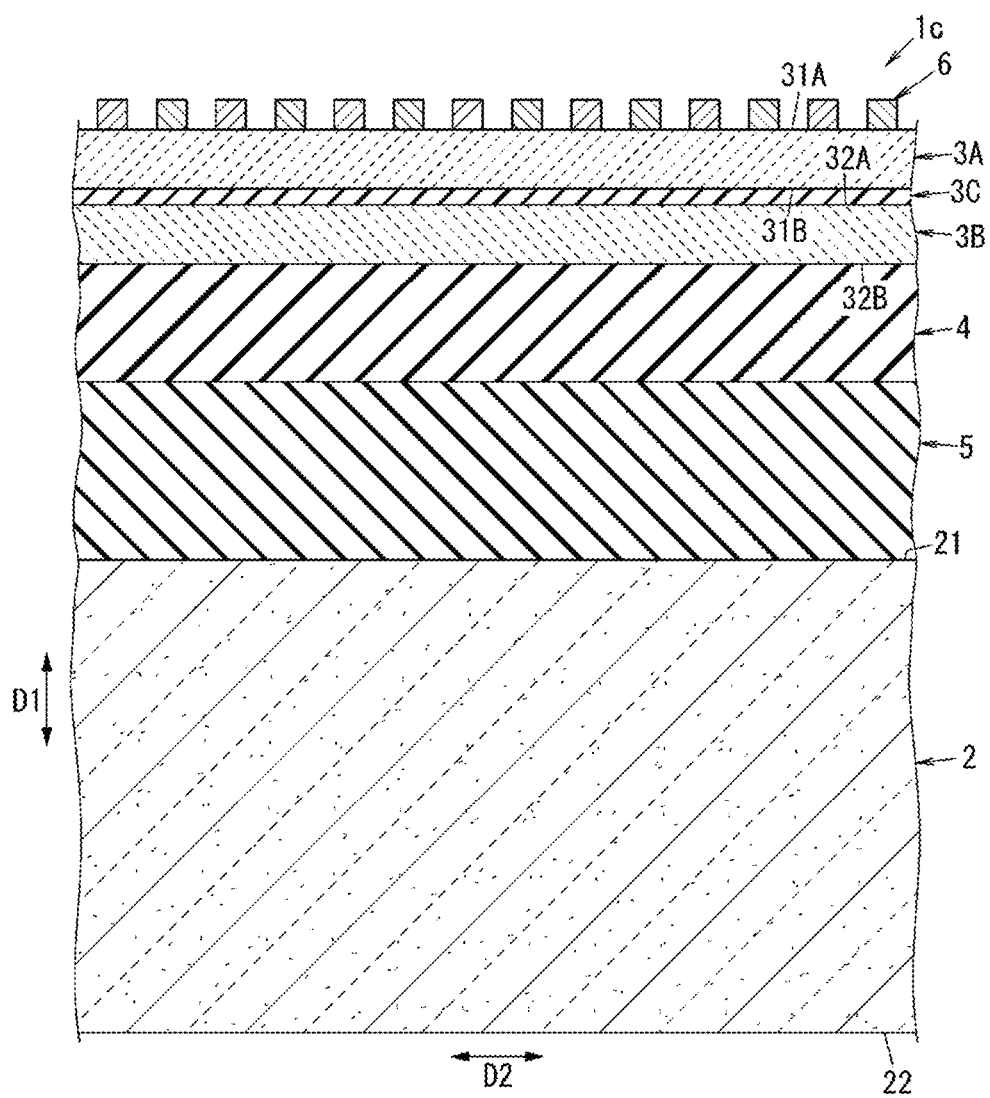
FIG. 18 is a cross-sectional view of an acoustic wave device in which an intermediate layer is inserted.

As in an acoustic wave device 1c illustrated in FIG. 18, an intermediate layer 3C including, for example, silicon oxide or silicon nitride may be inserted between the first piezoelectric layer 3A and the second piezoelectric layer 3B. The thickness of the intermediate layer is, for example, about 1 nm to about 30 nm. In particular, in a case where the intermediate layer is made of silicon oxide, frequency temperature characteristics can be improved.

Figure 4A:
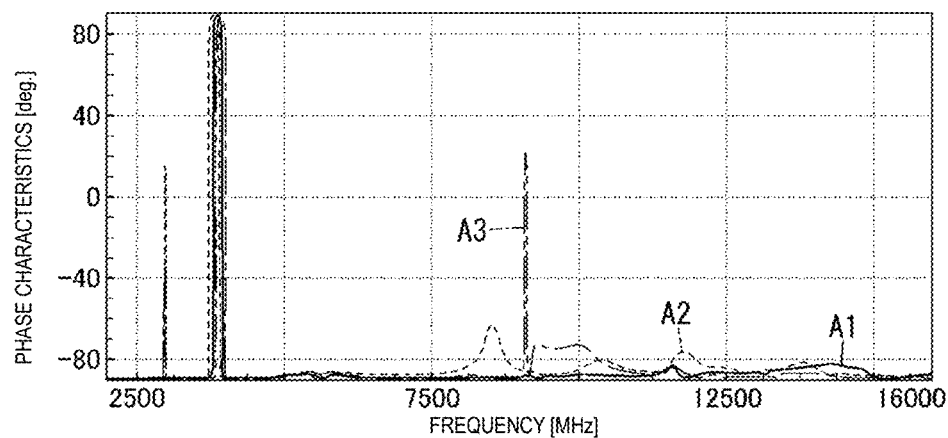
FIG. 4A is a graph illustrating phase characteristics of the acoustic wave device according to Preferred Embodiment 1 of the present invention.
Figure 4B:
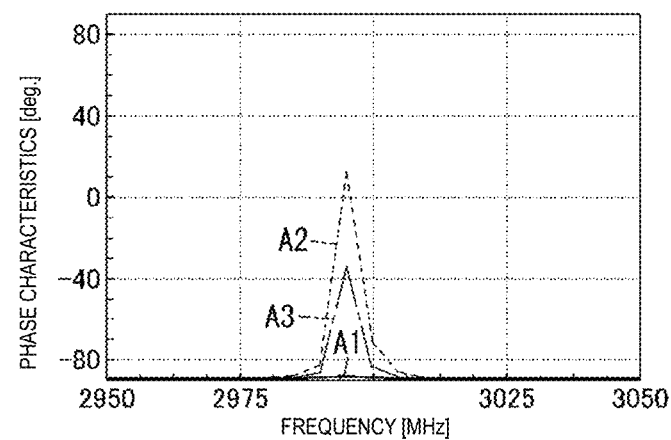
FIG. 4B is a graph illustrating Rayleigh mode phase characteristics of the acoustic wave device according to Preferred Embodiment 1 of the present invention.
Figure 4C:
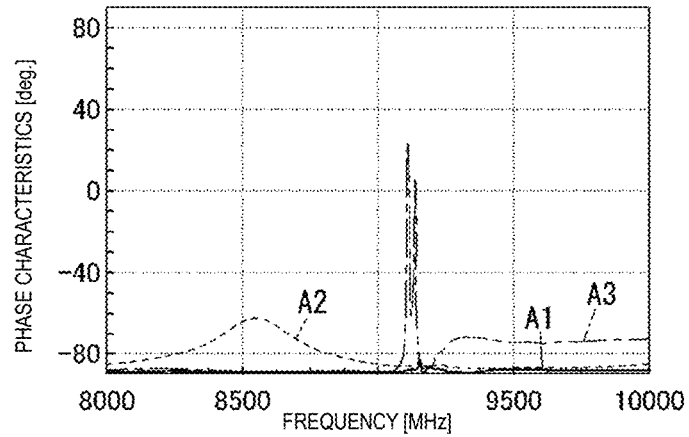
FIG. 4C is a graph illustrating higher-order mode phase characteristics of the acoustic wave device according to Preferred Embodiment 1 of the present invention.

FIG. 4A to FIG. 4C illustrate a phase characteristic A1 of the acoustic wave device 1 according to Preferred Embodiment 1, a phase characteristic A2 of an acoustic wave device according to Comparative Example 1, and a phase characteristic A3 of an acoustic wave device according to Comparative Example 2. In FIG. 4A to FIG. 4C, the phase characteristic A1 is indicated by a solid line, the phase characteristic A2 is indicated by a broken line, and the phase characteristic A3 is indicated by a dashed dotted line. FIG. 4B is an enlarged view of a low-frequency band (Rayleigh spurious response) in FIGS. 4A and 4C is an enlarged view of a high-frequency band in FIG. 4A.

In the acoustic wave device 1 according to Preferred Embodiment 1, both of the first piezoelectric layer 3A and the second piezoelectric layer 3B are lithium tantalate piezoelectric layers. In the acoustic wave device of Comparative Example 1 and the acoustic wave device of Comparative Example 2 as well, both of the first piezoelectric layer and the second piezoelectric layer are lithium tantalate piezoelectric layers. Assuming that the Euler angles of the first piezoelectric layer 3A are (0, θ1, 0) and the Euler angles of the second piezoelectric layer 3B are (0, θ2, 0), the phase characteristic A1 in FIGS. 4A to 4C is a phase characteristic when the second Euler angle θ1 is about 150° and the second Euler angle θ2 is about 90° in the acoustic wave device 1 according to Preferred Embodiment 1. The phase characteristic A2 is a phase characteristic of the acoustic wave device of Comparative Example 1 when the second Euler angles θ1 and θ2 are both about 90°. The phase characteristic A3 is a phase characteristic of the acoustic wave device of Comparative Example 2 when the second Euler angles θ1 and θ2 are both about 150°.

As illustrated in FIG. 4A, the phase characteristic A1 of the acoustic wave device 1 according to Preferred Embodiment 1 is better than the phase characteristics A2 and A3 of the acoustic wave devices of Comparative Examples 1 and 2 in the frequency bands excluding the frequency band of the main mode.

In particular, as illustrated in FIG. 4B, the acoustic wave device 1 according to Preferred Embodiment 1 can reduce or prevent the spurious response of the Rayleigh mode on the lower frequency side than the frequency band of the main mode, as compared to the acoustic wave devices of Comparative Examples 1 and 2. Meanwhile, as illustrated in FIG. 4A, also in the acoustic wave device 1 according to Preferred Embodiment 1, the characteristics of the main mode are obtained to the same or substantially the same extent as those of the acoustic wave devices of Comparative Examples 1 and 2.

Further, as illustrated in FIG. 4C, the acoustic wave device 1 according to Preferred Embodiment 1 can reduce or prevent the spurious response of the higher-order mode on the higher frequency side than the frequency band of the main mode, as compared to the acoustic wave devices of Comparative Examples 1 and 2. As described above, the higher-order mode is a spurious mode that occurs on the higher frequency side than the main mode of the acoustic wave propagating through the first piezoelectric layer 3A and the second piezoelectric layer 3B.

The conditions of the acoustic wave device 1 for obtaining the phase characteristic A1 of FIGS. 4A to 4C are as follows. The thickness of the IDT electrode 6 is about 0.05λ, the thickness of the first piezoelectric layer 3A is about 0.1λ, the thickness of the second piezoelectric layer 3B is about 0.1λ, the thickness of the low acoustic velocity film 4 is about 0.15λ, and the thickness of the high acoustic velocity film 5 is about 0.15λ. The material of the IDT electrode 6 is aluminum, the material of the first piezoelectric layer 3A and the second piezoelectric layer 3B is lithium tantalate, the material of the low acoustic velocity film 4 is silicon oxide, the material of the high acoustic velocity film 5 is silicon nitride, and the material of the support substrate 2 is silicon. In the acoustic wave device of Comparative Example 1, the thickness of the IDT electrode is about 0.05λ, the thickness of the first piezoelectric layer is about 0.2λ, the thickness of the low acoustic velocity film is about 0.15λ, and the thickness of the high acoustic velocity film is about 0.15λ. The material of the IDT electrode is aluminum, the material of the low acoustic velocity film is silicon oxide, the material of the high acoustic velocity film is silicon nitride, and the material of the support substrate is silicon. In the acoustic wave device of Comparative Example 2, the thickness of the IDT electrode is about 0.05λ, the thickness of the second piezoelectric layer is about 0.2λ, the thickness of the low acoustic velocity film is about 0.15λ, and the thickness of the high acoustic velocity film is about 0.15λ. The material of the IDT electrode is aluminum, the material of the low acoustic velocity film is silicon oxide, the material of the high acoustic velocity film is silicon nitride, and the material of the support substrate is silicon.

(4) Advantageous Effects

In the acoustic wave device 1 according to Preferred Embodiment 1, the Euler angles of the second piezoelectric layer 3B are different from the Euler angles of the first piezoelectric layer 3A. As such, it is possible to reduce or prevent the spurious response of the Rayleigh mode that occurs in the band on the lower frequency side than the excitation mode used to obtain the characteristics and the spurious response of the higher-order mode that occurs in the band on the higher frequency side than the above excitation mode. In addition, when the acoustic wave device 1 is used as a filter, it is possible to reduce or prevent the spurious response of the Rayleigh mode that occurs on the low frequency band side of the pass band of the filter and the spurious response of the higher-order mode that occurs on the high frequency band side of the pass band of the filter.

In the acoustic wave device 1 according to Preferred Embodiment 1, at least one of the first piezoelectric layer 3A and the second piezoelectric layer 3B is of a rotated Y-cut. Since the SH wave is easily excited in the rotated Y-cut, the coupling coefficient of the SH wave can be easily increased.

In the acoustic wave device 1 according to Preferred Embodiment 1, both of the first piezoelectric layer 3A and the second piezoelectric layer 3B are of a rotated Y-cut. Since the SH wave is easily excited in the rotated Y-cut, it is easy to further increase the coupling coefficient of the SH wave.

In the acoustic wave device 1 according to Preferred Embodiment 1, the low acoustic velocity film 4 is provided between the support substrate 2 and the second piezoelectric layer 3B in the thickness direction (first direction D1) of the support substrate 2. As such, the Q factor of the acoustic wave device 1 can be improved.

In the acoustic wave device 1 according to Preferred Embodiment 1, the high acoustic velocity film 5 is provided between the support substrate 2 and the low acoustic velocity film 4 in the thickness direction (first direction D1) of the support substrate 2. As such, the Q factor of the acoustic wave device 1 can be further improved.

(5) Modification

Hereinafter, a modification of Preferred Embodiment 1 will be described.

The acoustic wave device 1 may include an adhesion layer, a dielectric film, and the like as films other than the high acoustic velocity film 5, the low acoustic velocity film 4, the first piezoelectric layer 3A, and the second piezoelectric layer 3B.

The acoustic wave device 1 may further include a first terminal connected to the first busbar 62A via the first wiring portion 81 of the wiring portion 8, and a second terminal connected to the second busbar 62B via the second wiring portion 82 of the wiring portion 8. In addition, the acoustic wave device 1 may further include two third wiring portions respectively connected to the two reflectors 7. In this case, each of the two reflectors 7 may be connected to a third terminal via at least the third wiring portion. Each of a plurality of external connection terminals including the first terminal, the second terminal, and the third terminal is an electrode to electrically connect to a circuit substrate, a mounting substrate (submount substrate) for a package, or the like in the acoustic wave device 1. In addition, the acoustic wave device 1 may further include a plurality of dummy terminals that are not electrically connected to the IDT electrode 6. The plurality of dummy terminals are terminals to increase the parallelism of the acoustic wave device 1 with respect to the circuit substrate, the mounting substrate, or the like, and is different from a terminal for electrical connection. That is, the dummy terminal prevents the acoustic wave device 1 from being mounted on the circuit substrate, a mounting substrate, or the like in an inclined manner, and is not necessarily provided depending on the number and arrangement of the external connection terminals, the outer peripheral shape of the acoustic wave device 1, and the like.

For example, the first terminal is integral with the first wiring portion 81 with the same material and the same or substantially the same thickness as those of the first wiring portion 81. The second terminal is, for example, integral with the second wiring portion 82 with the same material and the same or substantially the same thickness as those of the second wiring portion 82. The third terminal is, for example, integral with the third wiring portion with the same material and the same or substantially the same thickness as those of the third wiring portion. The third wiring portion is made of, for example, the same material and the same or substantially the same thickness as those of the first wiring portion 81 and the second wiring portion 82.

Preferred Embodiment 2

Figure 5:
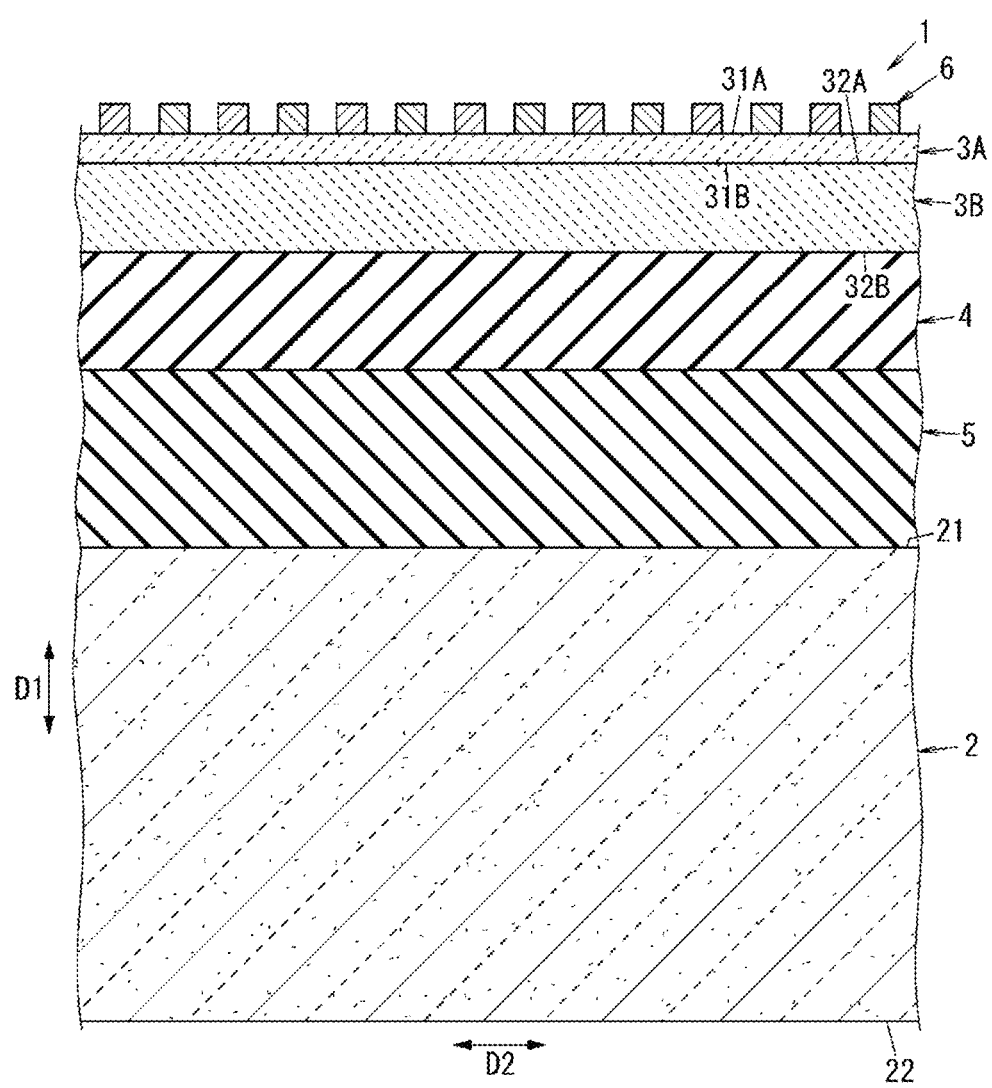
FIG. 5 is a cross-sectional view of an acoustic wave device according to Preferred Embodiment 2 of the present invention taken along a line X1-X1 in FIG. 1.

As illustrated in FIG. 5, an acoustic wave device 1 according to Preferred Embodiment 2 of the present invention is different from the acoustic wave device 1 (see FIG. 2) according to Preferred Embodiment 1 in that the thickness of the first piezoelectric layer 3A is different from the thickness of the second piezoelectric layer 3B. Regarding the acoustic wave device 1 according to Preferred Embodiment 2, the same elements as those of the acoustic wave device 1 according to Preferred Embodiment 1 are denoted by the same reference numerals, and a description thereof will be omitted.

(1) Configuration

As illustrated in FIG. 5, the acoustic wave device 1 according to Preferred Embodiment 2 includes the first piezoelectric layer 3A and the second piezoelectric layer 3B having thicknesses different from each other. The acoustic wave device according to Preferred Embodiment 2 includes the support substrate 2, the low acoustic velocity film 4, the high acoustic velocity film 5, the IDT electrode 6, the two reflectors 7, and the wiring portion 8, the same as or similar to the acoustic wave device 1 according to Preferred Embodiment 1.

In the acoustic wave device 1 according to Preferred Embodiment 2, the first piezoelectric layer 3A is thinner than the second piezoelectric layer 3B. For example, the thickness of the first piezoelectric layer 3A is about $0.05\lambda$, and the thickness of the second piezoelectric layer 3B is about $0.15\lambda$. Regarding the first piezoelectric layer 3A and the second piezoelectric layer 3B of Preferred Embodiment 2, description of the same or substantially the same configuration and function as those of the first piezoelectric layer 3A and the second piezoelectric layer 3B of Preferred Embodiment 1 will be omitted.

(2) Characteristics of Acoustic Wave Device

Figure 6:
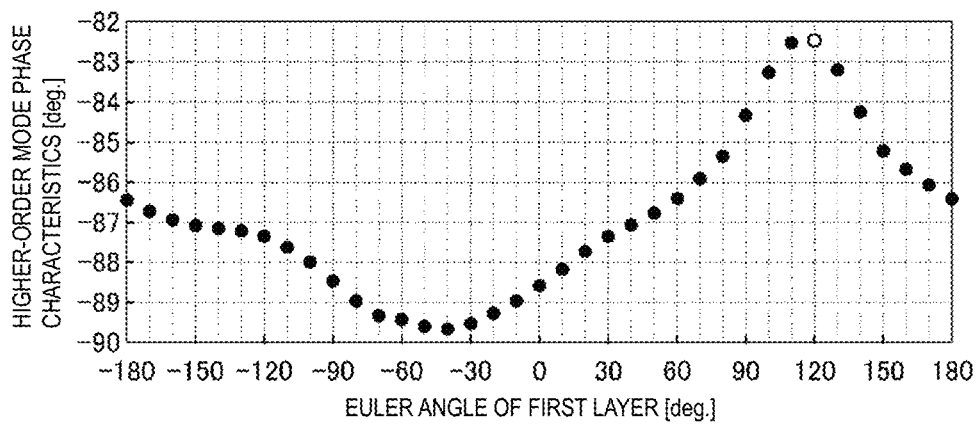
FIG. 6 is a graph illustrating higher-order mode phase characteristics of the acoustic wave device according to Preferred Embodiment 2 of the present invention.

Characteristics of the acoustic wave device 1 according to Preferred Embodiment 2 will be described below with reference to the drawings. In FIG. 6, the "Euler angle of the first layer" is the second Euler angle $\theta 1$ of the Euler angles $(0, \theta 1, 0)$ of the first piezoelectric layer 3A.

In the acoustic wave device 1 according to Preferred Embodiment 2, as illustrated in FIG. 6, in the case where the Euler angles of the first piezoelectric layer 3A are different from the Euler angles of the second piezoelectric layer 3B, the higher-order mode phase characteristics can be improved, as compared to the case where the Euler angles of the first piezoelectric layer 3A are the same as the Euler angles of the second piezoelectric layer 3B. In the example of FIG. 6, assuming that the Euler angles of the first piezoelectric layer 3A are $(0, \theta 1, 0)$ and the Euler angles of the second piezoelectric layer 3B are $(0, \theta 2, 0)$, the case where the Euler angles of the first piezoelectric layer 3A are the same or substantially the same as the Euler angles of the second piezoelectric layer 3B is the case where the second Euler angles $\theta 1$ and $\theta 2$ are both, for example, about $120°$.

The conditions of the acoustic wave device 1 for obtaining the phase characteristics of FIG. 6 are as follows. The thickness of the IDT electrode 6 is about $0.05\lambda$, the thickness of the first piezoelectric layer 3A is about $0.05\lambda$, the thickness of the second piezoelectric layer 3B is about $0.15\lambda$, the thickness of the low acoustic velocity film 4 is about $0.15\lambda$, and the thickness of the high acoustic velocity film 5 is about $0.15\lambda$. The material of the IDT electrode 6 is aluminum, the material of the first piezoelectric layer 3A and the second piezoelectric layer 3B is lithium tantalate, the material of the low acoustic velocity film 4 is silicon oxide, the material of the high acoustic velocity film 5 is silicon nitride, and the material of the support substrate 2 is silicon. Assuming that the Euler angles of the first piezoelectric layer 3A are $(0, \theta 1, 0)$ and the Euler angles of the second piezoelectric layer 3B are $(0, \theta 2, 0)$, the characteristics are obtained in the case where the second Euler angle $\theta 1$ is changed from about $-180°$ to about $180°$ when the second Euler angle $\theta 2$ is about $120°$.

(3) Advantageous Effects

Also in the acoustic wave device 1 according to Preferred Embodiment 2, similar to the acoustic wave device 1 according to Preferred Embodiment 1, in a case where the acoustic wave device 1 is used as a filter, it is possible to reduce or prevent the spurious response of the Rayleigh mode that occurs on the low frequency band side of the pass band of the filter and the spurious response of the higher-order mode that occurs on the high frequency band side of the pass band of the filter.

Further, in the acoustic wave device 1 according to Preferred Embodiment 2, a ratio of the thickness of the second piezoelectric layer 3A to the thickness of the first piezoelectric layer 3B is, for example, equal to or more than about 1/10 and equal to or less than about 10. With the above ratio, the advantageous effect of reducing or preventing the spurious response is large.

Preferred Embodiment 3

An acoustic wave device 1 according to Preferred Embodiment 3 of the present invention is different from the acoustic wave device 1 according to Preferred Embodiment 1 in that the second piezoelectric layer 3B is of an X-cut. Regarding the acoustic wave device 1 according to Preferred Embodiment 3, the same or substantially the same elements as those of the acoustic wave device 1 according to Preferred Embodiment 1 are denoted by the same reference numerals, and a description thereof will be omitted.

(1) Configuration

The acoustic wave device 1 according to Preferred Embodiment 3 includes an X-cut second piezoelectric layer 3B. The acoustic wave device 1 according to Preferred Embodiment 3 includes the support substrate 2, the first piezoelectric layer 3A, the low acoustic velocity film 4, the high acoustic velocity film 5, the IDT electrode 6, the two reflectors 7, and the wiring portion 8, the same as or similar to the acoustic wave device 1 according to Preferred Embodiment 1.

In Preferred Embodiment 3, the second piezoelectric layer 3B is not of a Y-cut, but an X-cut. The Euler angles of the second piezoelectric layer 3B are, for example, (90°, 90°, 0°). Meanwhile, the Euler angles of the first piezoelectric layer 3A are, for example, (0°, 90°, 0°). Regarding the second piezoelectric layer 3B of Preferred Embodiment 3, description of the same or substantially the same configuration and function as those of the second piezoelectric layer 3B of Preferred Embodiment 1 will be omitted.

(2) Characteristics of Acoustic Wave Device

Characteristics of the acoustic wave device 1 according to Preferred Embodiment 3 will be described below with reference to the drawings.

Figure 7A:
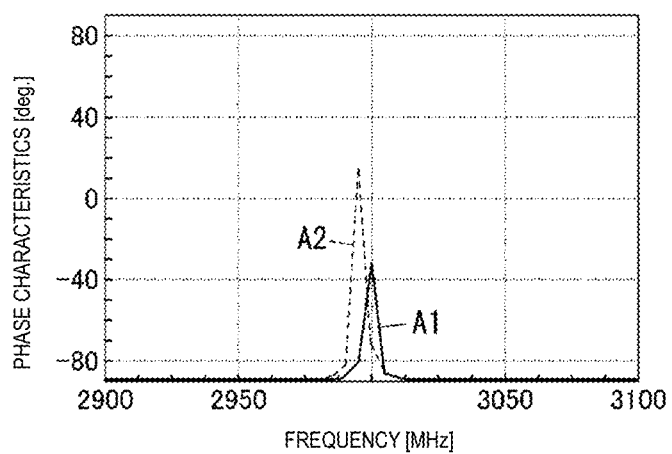
FIG. 7A is a graph illustrating Rayleigh mode phase characteristics of an acoustic wave device according to Preferred Embodiment 3 of the present invention.
Figure 7B:
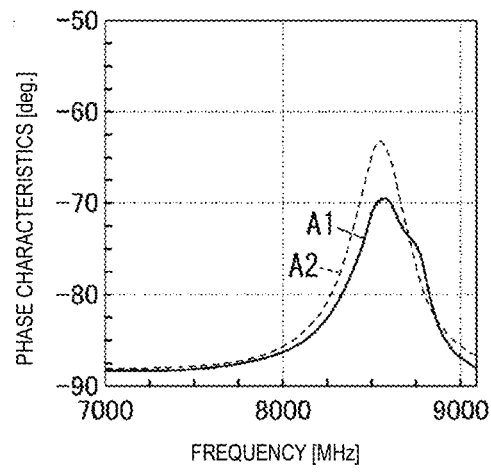
FIG. 7B is a graph illustrating higher-order mode phase characteristics of the acoustic wave device according to Preferred Embodiment 3 of the present invention.

FIGS. 7A and 7B illustrate the phase characteristic A1 of the acoustic wave device 1 according to Preferred Embodiment 2 and the phase characteristic A2 of the acoustic wave device according to Comparative Example 1. In FIGS. 7A and 7B, the phase characteristic A1 is indicated by a solid line, and the phase characteristic A2 is indicated by a broken line. FIG. 7A is an enlarged view of the low-frequency band (Rayleigh spurious response), and FIG. 7B is an enlarged view of the high-frequency band.

In the acoustic wave device 1 according to Preferred Embodiment 3, both of the first piezoelectric layer 3A and the second piezoelectric layer 3B are, for example, lithium tantalate piezoelectric layers. In the acoustic wave device of Comparative Example 1 as well, both of the first piezoelectric layer and the second piezoelectric layer are lithium tantalate piezoelectric layers. The phase characteristic A1 in FIGS. 7A and 7B is a phase characteristic in a case where the Euler angles of the first piezoelectric layer 3A are (0°, 120°, 0°) and the Euler angles of the second piezoelectric layer 3B are (90°, 90°, 0°) in the acoustic wave device 1 according to Preferred Embodiment 3. The phase characteristic A2 is a phase characteristic of the acoustic wave device of Comparative Example 1 in a case where the Euler angles of the first piezoelectric layer 3A and the Euler angles of the second piezoelectric layer 3B are both (0°, 90°, 0°).

As illustrated in FIG. 7A, the acoustic wave device 1 according to Preferred Embodiment 3 can reduce or prevent the spurious response of the Rayleigh mode on the lower frequency side than the frequency band of the main mode, as compared to the acoustic wave device of Comparative Example 1.

Further, as illustrated in FIG. 7B, the acoustic wave device 1 according to Preferred Embodiment 3 can reduce or prevent the spurious response of the higher-order mode on the higher frequency side than the frequency band of the main mode, as compared to the acoustic wave device of Comparative Example 1.

The conditions of the acoustic wave device 1 to obtain the phase characteristic A1 of FIGS. 7A and 7B are as follows. The thickness of the IDT electrode 6 is about $0.05\lambda$, the thickness of the first piezoelectric layer 3A is about $0.1\lambda$, the thickness of the second piezoelectric layer 3B is about $0.1\lambda$, the thickness of the low acoustic velocity film 4 is about $0.15\lambda$, and the thickness of the high acoustic velocity film 5 is about $0.15\lambda$. The material of the IDT electrode 6 is aluminum, the material of the first piezoelectric layer 3A and the second piezoelectric layer 3B is lithium tantalate, the material of the low acoustic velocity film 4 is silicon oxide, the material of the high acoustic velocity film 5 is silicon nitride, and the material of the support substrate 2 is silicon.

(3) Advantageous Effects

Also in the acoustic wave device 1 according to Preferred Embodiment 3, the same as or similar to the acoustic wave device 1 according to Preferred Embodiment 1, in a case where the acoustic wave device 1 is used as a filter, it is possible to reduce or prevent the spurious response of the Rayleigh mode that occurs on the low frequency band side of the pass band of the filter and the spurious response of the higher-order mode that occurs on the high frequency band side of the pass band of the filter.

(4) Modification

As a modification of Preferred Embodiment 3, the first piezoelectric layer 3A may be of a X-cut, and the second piezoelectric layer 3B may be of a Y-cut.

Also in the acoustic wave device 1 according to the above-described modification, advantageous effects the same as or similar to those of the acoustic wave device 1 according to Preferred Embodiment 3 are achieved.

Preferred Embodiment 4

An acoustic wave device 1 according to Preferred Embodiment 4 of the present invention is different from the acoustic wave device 1 according to Preferred Embodiment 1 in that an electromechanical coupling coefficient is, for example, equal to or more than about 4.0%. Regarding the acoustic wave device 1 according to Preferred Embodiment 4, the same or substantially the same elements as those of the acoustic wave device 1 according to Preferred Embodiment 1 are denoted by the same reference numerals, and a description thereof will be omitted.

(1) Configuration

In the acoustic wave device 1 according to Preferred Embodiment 4, the Euler angles of the first piezoelectric layer 3A and the Euler angles of the second piezoelectric layer 3B are set such that the electromechanical coupling coefficient is, for example, equal to or more than about 4.0%. The electromechanical coupling coefficient is represented by the following Expression (1). Expression (1) represents an expression in which the electromechanical coupling coefficient is calculated as a percentage. The second Euler angle θ1 satisfies 01=01+180°×n (n=0, ±1, ±2). The thickness of the first piezoelectric layer 3A is denoted by LT1, and the thickness of the second piezoelectric layer 3B is denoted by LT2. Regarding the first piezoelectric layer 3A and the second piezoelectric layer 3B of Preferred Embodiment 4, description of the same or substantially the same configuration and function as those of the first piezoelectric layer 3A and the second piezoelectric layer 3B of Preferred Embodiment 1 will be omitted.

$$\begin{aligned}
&3.00330520967856 + \\
&0.346620517082123 \times \left(\frac{LT1}{LT2} - 1.444444444433334\right) + \\
&0.0570057523277407 \times (\theta1 - 85.5) + \\
&0.0124323016193303 \times (\theta2 - 0) + \\
&(-0.00066220403802972) \times \\
&\{(\theta1 - 85.5) \times (\theta1 - 85.5) - 3234.75\} + \\
&(-0.0000074522275643441) \times \\
&\{(\theta1 - 85.5) \times (\theta1 - 85.5) \times (\theta1 - 85.5) - 7310.25\} + \\
&0.0000000527344575735 \times \{(\theta1 - 85.5) \times (\theta1 - 85.5) \times \\
&(\theta1 - 85.5) \times (\theta1 - 85.5) - 18351652.3125\} + \\
&0.000224701682752685 \times \{(\theta2 - 0) \times (\theta2 - 0) - 11400\} + \\
&0.0000009558742707317 \times \\
&\{(\theta2 - 0) \times (\theta2 - 0) \times (\theta2 - 0) - 0\} + \\
&(-0.0000000059893558361) \times \\
&\{(\theta2 - 0) \times (\theta2 - 0) \times (\theta2 - 0) \times (\theta2 - 0) - 233700000\} + \\
&\left(-4.32597449093616 \times 10^{-11}\right) \times \{(\theta2 - 0) \times \\
&(\theta2 - 0) \times (\theta2 - 0) \times (\theta2 - 0) \times (\theta2 - 0) - 0\}
\end{aligned}$$

Expression (1)

(2) Characteristics of Acoustic Wave Device

Figure 8A:
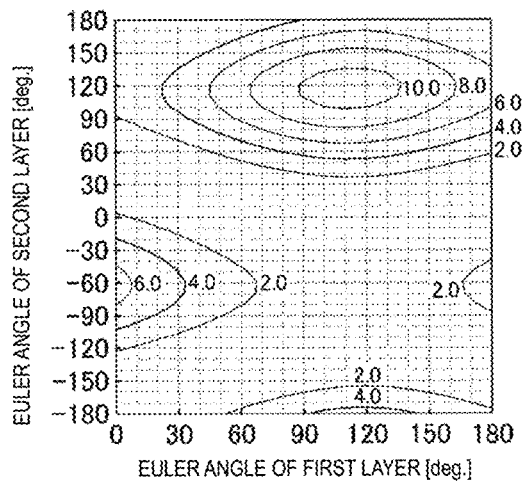
FIGS. 8A to 8C are contour drawings illustrating characteristics of an electromechanical coupling coefficient in an acoustic wave device according to Preferred Embodiment 4 of the present invention.
Figure 8B:
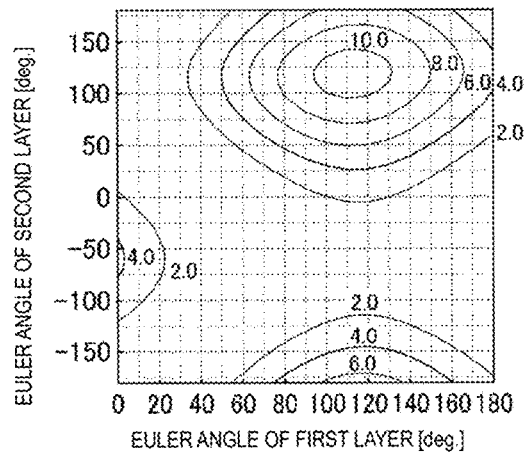
Figure 8C:
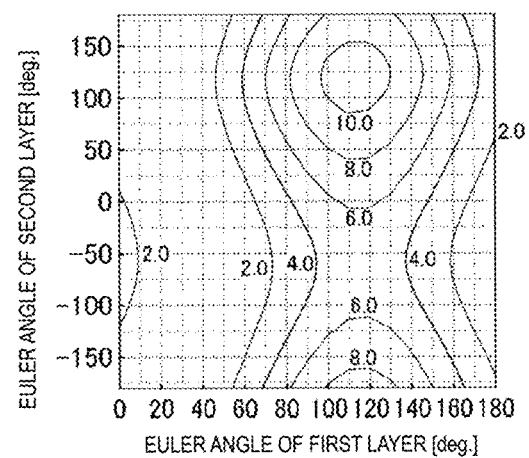

FIGS. 8A to 8C illustrate characteristics of the electromechanical coupling coefficient when a ratio (LT1/LT2) of the thickness LT1 of the first piezoelectric layer 3A to the thickness LT2 of the second piezoelectric layer 3B is changed. In each of FIG. 8A to FIG. 8C, the "Euler angle of the first layer" is the second Euler angle θ1 of the Euler angles (0, θ1, 0) of the first piezoelectric layer 3A, and the "Euler angle of the second layer" is the second Euler angle θ2 of the Euler angles (0, θ2, 0) of the second piezoelectric layer 3B. The conditions of the acoustic wave device 1 to obtain the characteristics of the electromechanical coupling coefficient of FIG. 8A to FIG. 8C are as follows. The thickness of the IDT electrode 6 is about 0.05λ, the thickness of the low acoustic velocity film 4 is about 0.15λ, and the thickness of the high acoustic velocity film 5 is about 0.15λ. The material of the IDT electrode 6 is aluminum, the material of the low acoustic velocity film 4 is silicon oxide, the material of the high acoustic velocity film 5 is silicon nitride, and the material of the support substrate 2 is silicon.

FIG. 8A illustrates characteristics of the electromechanical coupling coefficient in a case where the ratio (LT1/LT2) is about 0.33. Good characteristics can be obtained by selecting a combination of the second Euler angles θ1 and θ2 such that the electromechanical coupling coefficient is equal to or more than about 4.0%.

FIG. 8B illustrates characteristics of the electromechanical coupling coefficient in a case where the ratio (LT1/LT2) is 1. As in the case where the ratio (LT1/LT2) is about 0.33, good characteristics can be obtained by selecting a combination of the second Euler angles θ1 and θ2 such that the electromechanical coupling coefficient is equal to or more than about 4.0%.

FIG. 8C illustrates characteristics of the electromechanical coupling coefficient in a case the ratio (LT1/LT2) is about 3. As in the case where the ratio (LT1/LT2) is about 0.33, good characteristics can be obtained by selecting a combination of the second Euler angles θ1 and θ2 such that the electromechanical coupling coefficient is equal to or more than about 4.0%.

(3) Advantageous Effects

In the acoustic wave device 1 according to Preferred Embodiment 4, the electromechanical coupling coefficient is about 4.0%. This makes it possible to efficiently excite the mode in which an SH wave is a main component. As described above, Expression (1) is an expression in which the electromechanical coupling coefficient is calculated as a percentage. Therefore, the second Euler angle θ1 and the second Euler angle θ2 are values such that the electromechanical coupling coefficient represented by Expression (1) is equal to or more than about 4.0%.

Preferred Embodiment 5

An acoustic wave device 1 according to Preferred Embodiment 5 of the present invention is different from the acoustic wave device 1 according to Preferred Embodiment 1 in that the absolute value of a TCF is, for example, equal to or less than about 10 ppm/° C. Regarding the acoustic wave device 1 according to Preferred Embodiment 5, the same or substantially the same elements as those of the acoustic wave device 1 according to Preferred Embodiment 1 are denoted by the same reference numerals, and a description thereof will be omitted.

(1) Configuration

In the acoustic wave device 1 according to Preferred Embodiment 5, the Euler angles of the first piezoelectric layer 3A and the Euler angles of the second piezoelectric layer 3B are set such that the absolute value of the TCF is, for example, equal to or less than about 10 ppm/° C. The TCF is represented by the following Expression (2). The thickness of the first piezoelectric layer 3A is denoted by LT1, and the thickness of the second piezoelectric layer 3B is denoted by LT2. Note that regarding the first piezoelectric layer 3A and the second piezoelectric layer 3B of Preferred Embodiment 5, description of the same configuration and function as those of the first piezoelectric layer 3A and the second piezoelectric layer 3B of Preferred Embodiment 1 will be omitted.

$$\begin{aligned}
&-3.29013891692386 + \\
&\quad 0.829996307633191 \times \left(\frac{LT1}{LT2} - 1.44444444433334\right) + \\
&\quad 0.483995654864519 \times (\theta 1 - 85.5) + \\
&\quad (-0.194567821179747) \times (\theta 2 - 0) + \\
&\quad 0.000179452385587509 \times \\
&\quad \{(\theta 1 - 85.5) \times (\theta 1 - 85.5) - 3234.75\} + \\
&\quad (-0.0000974537560393475) \times \\
&\quad \{(\theta 1 - 85.5) \times (\theta 1 - 85.5) \times (\theta 1 - 85.5) \times (\theta 1 - 85.5) - \\
&\quad 7310.25\} + (-0.0000000192594958352) \times \\
&\quad \{(\theta 1 - 85.5) \times (\theta 1 - 85.5) \times (\theta 1 - 85.5) \times (\theta 1 - 85.5) - \\
&\quad 18351652.3125\} + 0.0000000046470081457 \times \\
&\quad \{(\theta 1 - 85.5) \times (\theta 1 - 85.5) \times (\theta 1 - 85.5) \times \\
&\quad (\theta 1 - 85.5) \times (\theta 1 - 85.5) - 119136362.625\} + \\
&\quad (-0.000422585955937192) \times \{(\theta 2 - 0) \times (\theta 2 - 0) - 11400\} + \\
&\quad 0.0000232656788288669 \times \\
&\quad \{(\theta 2 - 0) \times (\theta 2 - 0) \times (\theta 2 - 0) - 0\} + \\
&\quad 0.0000000132633840535 \times \\
&\quad \{(\theta 2 - 0) \times (\theta 2 - 0) \times (\theta 2 - 0) \times (\theta 2 - 0) - 233700000\} + \\
&\quad (-0.0000000005476321966) \times \\
&\quad \{(\theta 2 - 0) \times (\theta 2 - 0) \times (\theta 2 - 0) \times (\theta 2 - 0) \times (\theta 2 - 0) - 0\} + \\
&\quad 0.0224071239542036 \times \\
&\quad \left(\frac{LT1}{LT2} - 1.44444444433334\right) \times (\theta 1 - 85.5) + \\
&\quad (-0.000253262537154296) \times (\theta 1 - 85.5) \times (\theta 2 - 0)
\end{aligned}$$

Expression (2)

(2) Characteristics of Acoustic Wave Device

Figure 9A:
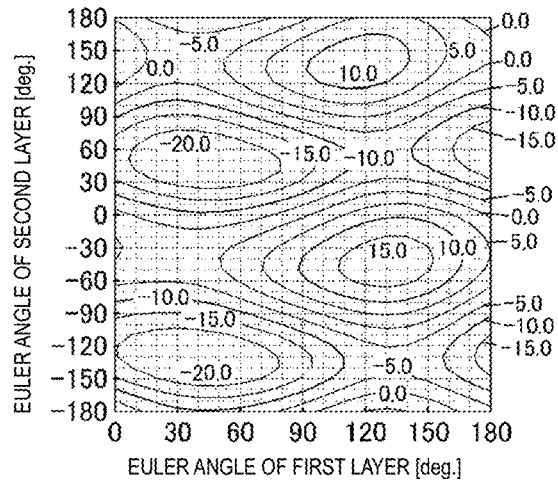
FIGS. 9A to 9C are contour drawings illustrating characteristics of the electromechanical coupling coefficient in an acoustic wave device according to Preferred Embodiment 5 of the present invention.
Figure 9B:
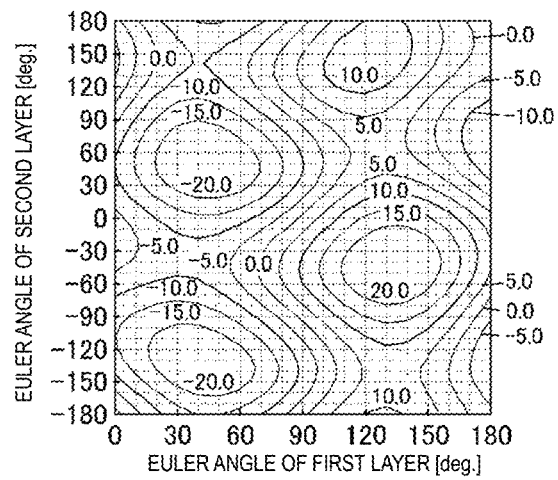
Figure 9C:
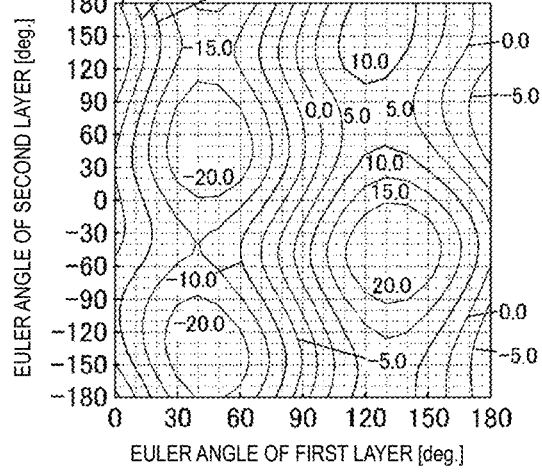

FIGS. 9A to 9C illustrate characteristics of the TCF when the ratio (LT1/LT2) of the thickness LT1 of the first piezoelectric layer 3A to the thickness LT2 of the second piezoelectric layer 3B is changed. In each of FIG. 9A to FIG. 9C, the "Euler angle of the first layer" is the second Euler angle $\theta 1$ of the Euler angles (0, $\theta 1$, 0) of the first piezoelectric layer 3A, and the "Euler angle of the second layer" is the second Euler angle $\theta 2$ of the Euler angles (0, $\theta 2$, 0) of the second piezoelectric layer 3B. The conditions of the acoustic wave device 1 to obtain the characteristics of the TCF of FIG. 9A to FIG. 9C are as follows. The thickness of the IDT electrode 6 is about 0.05λ, the thickness of the low acoustic velocity film 4 is about 0.15λ, and the thickness of the high acoustic velocity film 5 is about 0.15λ. The material of the IDT electrode 6 is aluminum, the material of the low acoustic velocity film 4 is silicon oxide, the material of the high acoustic velocity film 5 is silicon nitride, and the material of the support substrate 2 is silicon.

FIG. 9A illustrates the characteristics of the TCF when the ratio (LT1/LT2) is about 0.33. Good characteristics can be obtained by selecting a combination of the second Euler angles $\theta 1$ and $\theta 2$ so that the TCF falls within a range of equal to or more than about −10 ppm/° C. and equal to less than about 10 ppm/° C.

FIG. 9B illustrates the characteristics of the TCF when the ratio (LT1/LT2) is about 1. As in the case where the ratio (LT1/LT2) is about 0.33, good characteristics can be obtained by selecting a combination of the second Euler angles $\theta 1$ and $\theta 2$ such that the TCF falls within the range of equal to or more than about −10 ppm/° C. and equal to or less than about 10 ppm/° C.

FIG. 9C illustrates the characteristics of the TCF when the ratio (LT1/LT2) is about 3. As in the case where the ratio (LT1/LT2) is about 0.33, good characteristics can be obtained by selecting a combination of the second Euler angles $\theta 1$ and $\theta 2$ such that the TCF falls within the range of equal to or more than about −10 ppm/° C. and equal to or less than about 10 ppm/° C.

(3) Advantageous Effects

In the acoustic wave device 1 according to Preferred Embodiment 5, the absolute value of the TCF is in a range of, for example, equal to or less than about 10 ppm/° C. With this, a good TCF can be achieved.

Preferred Embodiment 6

Figure 10:
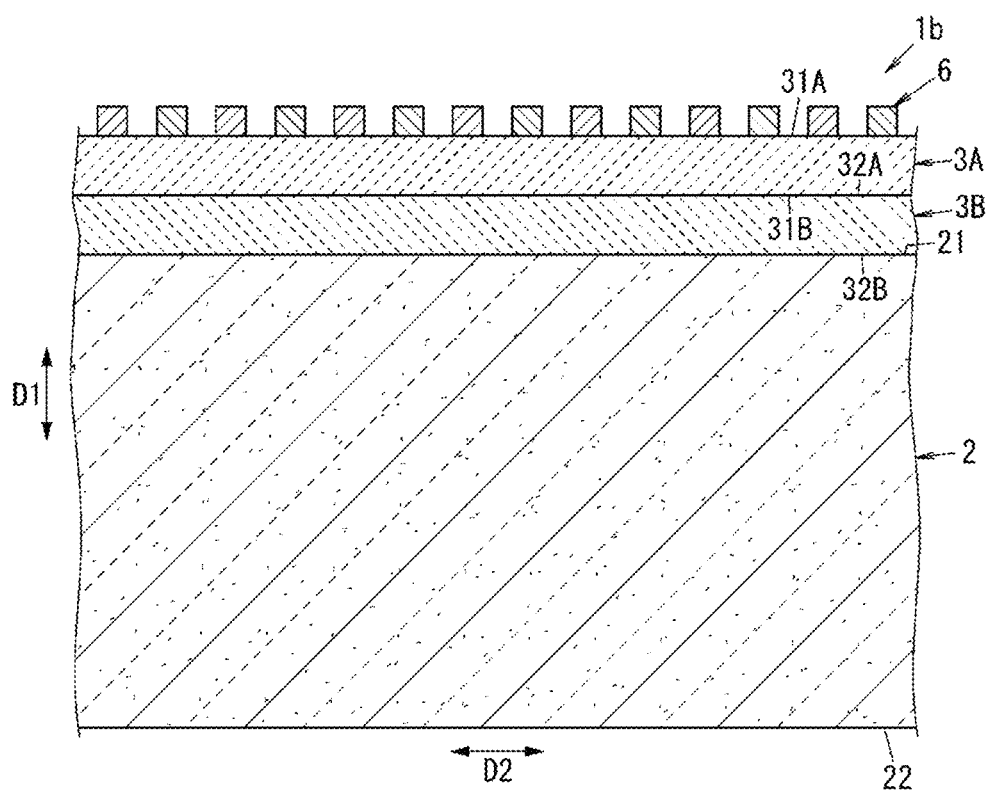
FIG. 10 is a cross-sectional view of an acoustic wave device according to Preferred Embodiment 6 of the present invention.

As illustrated in FIG. 10, an acoustic wave device 1b according to Preferred Embodiment 6 of the present invention is different from the acoustic wave device 1 (see FIG. 2) according to Preferred Embodiment 1 in that the second piezoelectric layer 3B is directly provided on the support substrate 2. Regarding the acoustic wave device 1b according to Preferred Embodiment 6, the same or substantially the same elements as those of the acoustic wave device 1 according to Preferred Embodiment 1 are denoted by the same symbols, and description thereof will be omitted.

(1) Configuration

In the acoustic wave device 1b according to Preferred Embodiment 6, as illustrated in FIG. 10, the second piezoelectric layer 3B is provided directly on the support substrate 2. That is, the acoustic wave device 1b does not include the low acoustic velocity film 4 and the high acoustic velocity film 5. Meanwhile, the acoustic wave device 1b includes the support substrate 2, the first piezoelectric layer 3A and the second piezoelectric layer 3B, and the IDT electrode 6, the same as or similar to the acoustic wave device 1 according to Preferred Embodiment 1.

(2) Characteristics of Acoustic Wave Device

Figure 11:
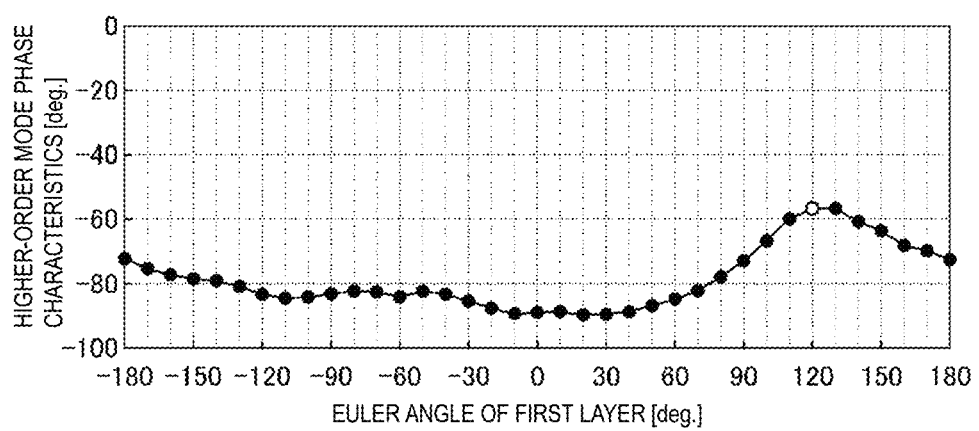
FIG. 11 is a graph illustrating higher-order mode phase characteristics of the acoustic wave device according to Preferred Embodiment 6 of the present invention.

Also in the acoustic wave device 1b according to Preferred Embodiment 6, as illustrated in FIG. 11, in the case where the Euler angles of the first piezoelectric layer 3A are different from the Euler angles of the second piezoelectric layer 3B, higher-order mode phase characteristics can be improved, as compared to the case where the Euler angles of the first piezoelectric layer 3A are the same as the Euler angles of the second piezoelectric layer 3B. In the example of FIG. 11, the case where the Euler angles of the first piezoelectric layer 3A are the same or substantially the same as the Euler angles of the second piezoelectric layer 3B is a case where the second Euler angles $\theta 1$ and $\theta 2$ are both about 120° in the Euler angles (0, $\theta 1$, 0) of the first piezoelectric layer 3A and the Euler angles (0, θ2, 0) of the second piezoelectric layer 3B. In FIG. 11, the "Euler angle of the first layer" is the second Euler angle θ1 of the Euler angles (0, θ1, 0) of the first piezoelectric layer 3A.

(3) Advantageous Effects

Also in the acoustic wave device 1b according to Preferred Embodiment 6, the same as similar to the acoustic wave device 1 according to Preferred Embodiment 1, in a case where the acoustic wave device 1b is used as a filter, it is possible to reduce or prevent a spurious response of a Rayleigh mode that occurs on the low frequency band side of the pass band of the filter and a spurious response of a higher-order mode that occurs on the high frequency band side of the pass band of the filter.

Preferred Embodiment 7

Figure 12:
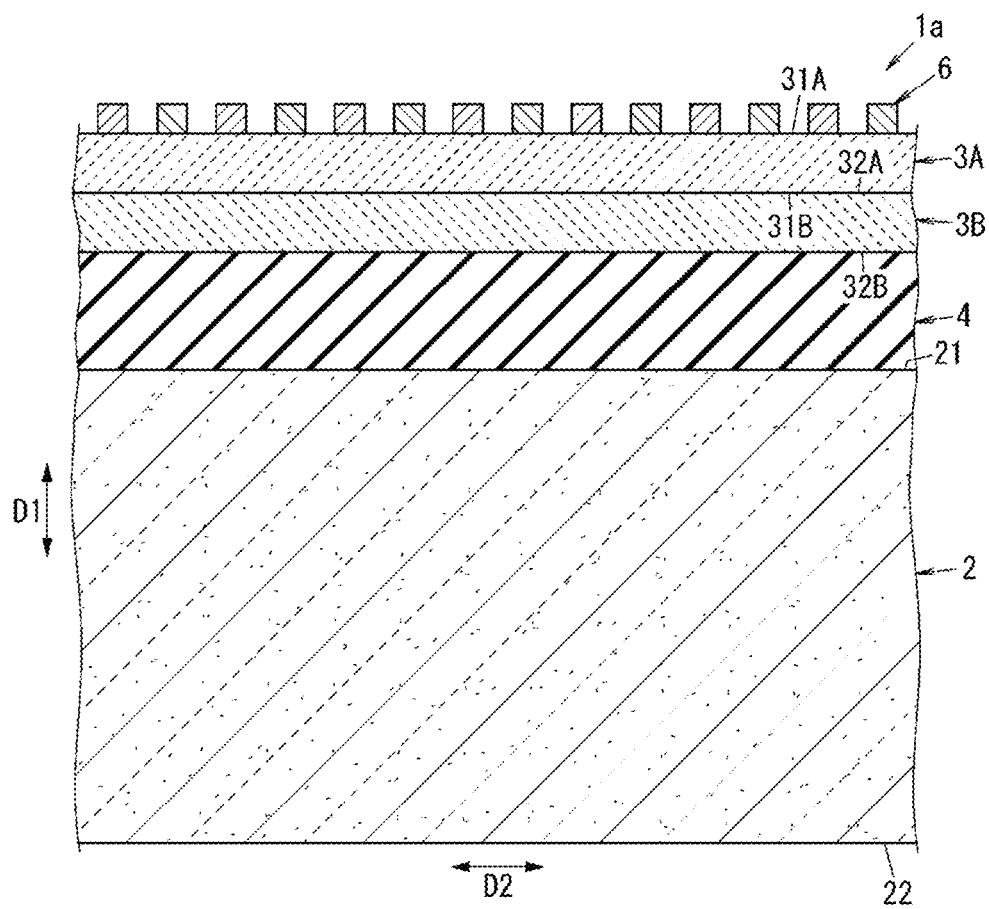
FIG. 12 is a cross-sectional view of an acoustic wave device according to Preferred Embodiment 7 of the present invention.

As illustrated in FIG. 12, an acoustic wave device 1a according to Preferred Embodiment 7 of the present invention is different from the acoustic wave device 1 (see FIG. 2) according to Preferred Embodiment 1 in that the high acoustic velocity film 5 is not provided. Regarding the acoustic wave device 1a according to Preferred Embodiment 7, the same or substantially the same elements as those of the acoustic wave device 1 according to Preferred Embodiment 1 are denoted by the same symbols, and description thereof will be omitted.

(1) Configuration

As illustrated in FIG. 12, the acoustic wave device 1a according to Preferred Embodiment 7 does not include the high acoustic velocity film 5. In other words, the low acoustic velocity film 4 is directly provided on the support substrate 2. Meanwhile, the acoustic wave device 1a includes the support substrate 2, the first piezoelectric layer 3A and the second piezoelectric layer 3B, the low acoustic velocity film 4, and IDT electrode 6, the same as or similar to the acoustic wave device 1 according to Preferred Embodiment 1.

In the acoustic wave device 1a according to Preferred Embodiment 7, the support substrate 2 is a high acoustic velocity support substrate. The high acoustic velocity support substrate is a support substrate in which the acoustic velocity of a bulk wave propagating through the high acoustic velocity support substrate is higher than the acoustic velocity of an acoustic wave propagating through the first piezoelectric layer 3A and the second piezoelectric layer 3B. With this, a Q factor of the acoustic wave device 1a can be further improved.

(2) Characteristics of Acoustic Wave Device

Figure 13:
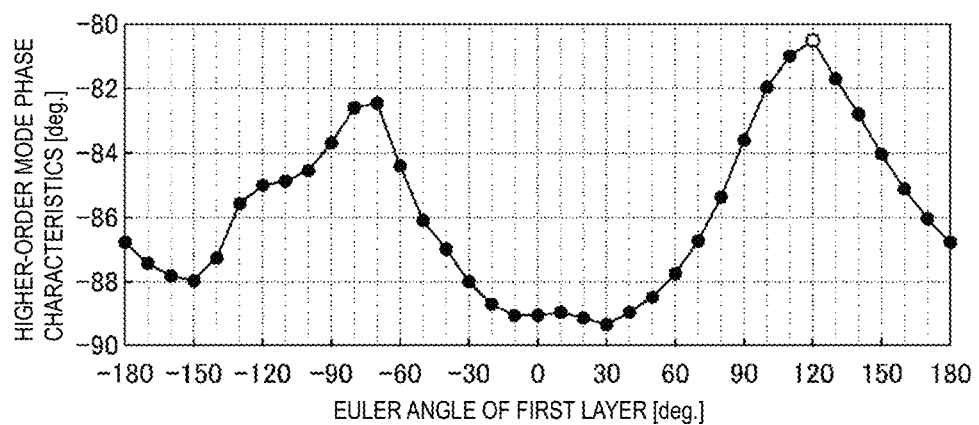
FIG. 13 is a graph illustrating higher-order mode phase characteristics of the acoustic wave device according to Preferred Embodiment 7 of the present invention.

Also in the acoustic wave device 1a according to Preferred Embodiment 7, as illustrated in FIG. 13, in the case where the Euler angles of the first piezoelectric layer 3A are different from the Euler angles of the second piezoelectric layer 3B, higher-order mode phase characteristics can be improved, as compared to the case where the Euler angles of the first piezoelectric layer 3A are the same as the Euler angles of the second piezoelectric layer 3B. In the example of FIG. 13, the case where the Euler angles of the first piezoelectric layer 3A are the same as the Euler angles of the second piezoelectric layer 3B is a case where the second Euler angles θ1 and θ2 are both about 120° in the Euler angles (0, θ1, 0) of the first piezoelectric layer 3A and the Euler angles (0, θ2, 0) of the second piezoelectric layer 3B. Note that in FIG. 13, the "Euler angle of the first layer" is the second Euler angle θ1 of the Euler angles (0, θ1, 0) of the first piezoelectric layer 3A.

(3) Advantageous Effects

Also in the acoustic wave device 1a according to Preferred Embodiment 7, the same as or similar to the acoustic wave device 1 according to Preferred Embodiment 1, the low acoustic velocity film 4 is provided between the support substrate 2 and the second piezoelectric layer 3B in the thickness direction (first direction D1) of the support substrate 2. With this, the Q factor of the acoustic wave device 1a can be improved.

In the acoustic wave device 1a according to Preferred Embodiment 7, the support substrate 2 is a high acoustic velocity support substrate. As such, the Q factor of the acoustic wave device 1a can be further improved.

Preferred Embodiment 8

An acoustic wave device 1 according to Preferred Embodiment 8 of the present invention is different from the acoustic wave device 1 according to Preferred Embodiment 1 in that the first piezoelectric layer 3A and the second piezoelectric layer 3B are made of lithium niobate ($LiNbO_3$). Regarding the acoustic wave device 1 according to Preferred Embodiment 8, the same or substantially the same elements as those of the acoustic wave device 1 according to Preferred Embodiment 1 are denoted by the same reference numerals, and a description thereof will be omitted.

(1) Configuration

The acoustic wave device 1 according to Preferred Embodiment 8 includes the first piezoelectric layer 3A and the second piezoelectric layer 3B which are both lithium niobate. The acoustic wave device 1 according to Preferred Embodiment 8 includes the support substrate 2, the low acoustic velocity film 4, the high acoustic velocity film 5, the IDT electrode 6, the two reflectors 7, and the wiring portion 8, the same as or similar to the acoustic wave device 1 according to Preferred Embodiment 1.

(1.1) First Piezoelectric Layer

The first piezoelectric layer 3A is made of, for example, a Y-cut X-propagation $LiNbO_3$ piezoelectric single crystal. The Y-cut X-propagation $LiNbO_3$ piezoelectric single crystal is, for example, a $LiNbO_3$ single crystal, when three crystal axes of a $LiTaO_3$ piezoelectric single crystal are defined as an X-axis, a Y-axis, and a Z-axis, provided by cutting at a plane in which an axis rotated by θ1[°] about the X-axis as a central axis in a Z-axis direction from the Y-axis is a normal line, and is a single crystal through which the surface acoustic wave propagates in an X-axis direction. As for the cut angle of the first piezoelectric layer 3A, when the cut angle is represented by Γ1[°] and the Euler angles of the first piezoelectric layer 3A are represented by (φ1, θ1, ψ1), θ1=Γ1+90° is satisfied. However, Γ1 and Γ1±180×n are synonymous. Here, n is a natural number. The first piezoelectric layer 3A is not limited to the Y-cut X-propagation $LiNbO_3$ piezoelectric single crystal, and may be, for example, a Y-cut X-propagation $LiNbO_3$ piezoelectric ceramic.

In a case where the first piezoelectric layer 3A is made of, for example, a Y-cut X-propagation LiNbO$_3$ piezoelectric single crystal or a piezoelectric ceramic, the acoustic wave device 1 can use a mode in which an SH wave is a main component as a main mode by using a Love wave as an acoustic wave.

(1.2) Second Piezoelectric Layer

The second piezoelectric layer 3B is made of, for example, a Y-cut X-propagation LiNbO$_3$ piezoelectric single crystal. The Y-cut X-propagation LiNbO$_3$ piezoelectric single crystal is, for example, a LiNbO$_3$ single crystal, when three crystal axes of a LiTaO$_3$ piezoelectric single crystal are defined as an X-axis, a Y-axis, and a Z-axis, provided by cutting at a plane in which an axis rotated by $\theta2[°]$ about the X-axis as a central axis in a Z-axis direction from the Y-axis is a normal line, and is a single crystal through which the surface acoustic wave propagates in an X-axis direction. As for the cut angle of the second piezoelectric layer 3B, when the cut angle is represented by $\Gamma2[°]$ and the Euler angles of the second piezoelectric layer 3B are represented by ($\varphi2$, $\theta2$, $\psi2$), $\theta2=\Gamma2+90°$ is satisfied. However, $\Gamma2$ and $\Gamma2\pm180\times n$ are synonymous. Here, n is a natural number. The second piezoelectric layer 3B is not limited to the Y-cut X-propagation LiNbO$_3$ piezoelectric single crystal, and may be, for example, a Y-cut X-propagation LiNbO$_3$ piezoelectric ceramic.

In a case where the second piezoelectric layer 3B is made of, for example, a Y-cut X-propagation LiNbO$_3$ piezoelectric single crystal or a piezoelectric ceramic, the acoustic wave device 1 can use a mode in which an SH wave is a main component as a main mode by using the Love wave as an acoustic wave.

(2) Characteristics of Acoustic Wave Device

Characteristics of the acoustic wave device 1 according to Preferred Embodiment 8 will be described below with reference to the drawings. Note that in FIG. 14, the "Euler angle of the first layer" is the second Euler angle $\theta1$ of the Euler angles (0, $\theta1$, 0) of the first piezoelectric layer 3A.

Figure 14:
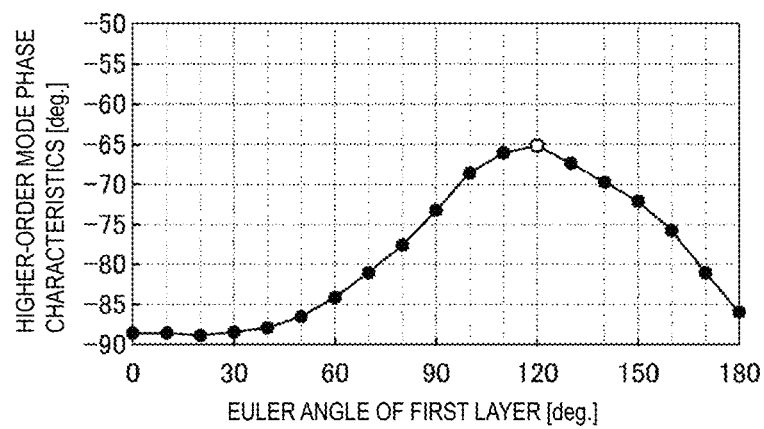
FIG. 14 is a graph illustrating higher-order mode phase characteristics of an acoustic wave device according to Preferred Embodiment 8 of the present invention.

In the acoustic wave device 1 according to Preferred Embodiment 8, as illustrated in FIG. 14, in the case where the Euler angles of the first piezoelectric layer 3A are different from the Euler angles of the second piezoelectric layer 3B, higher-order mode phase characteristics can be improved, as compared to the case where the Euler angles of the first piezoelectric layer 3A are the same as the Euler angles of the second piezoelectric layer 3B. In the example of FIG. 14, assuming that the Euler angles of the first piezoelectric layer 3A are (0, $\theta1$, 0) and the Euler angles of the second piezoelectric layer 3B are (0, $\theta2$, 0), the case where the Euler angles of the first piezoelectric layer 3A are the same as the Euler angles of the second piezoelectric layer 3B is the case where the second Euler angles $\theta1$ and $\theta2$ are both about 120°.

Note that the conditions of the acoustic wave device 1 for obtaining the phase characteristics of FIG. 14 are as follows. The thickness of the IDT electrode 6 is about 0.05$\lambda$, the thickness of the first piezoelectric layer 3A is about 0.05$\lambda$, the thickness of the second piezoelectric layer 3B is about 0.15$\lambda$, the thickness of the low acoustic velocity film 4 is about 0.15$\lambda$, and the thickness of the high acoustic velocity film 5 is about 0.15$\lambda$. The material of the IDT electrode 6 is aluminum, the material of the first piezoelectric layer 3A and the second piezoelectric layer 3B is lithium niobate, the material of the low acoustic velocity film 4 is silicon oxide, the material of the high acoustic velocity film 5 is silicon nitride, and the material of the support substrate 2 is silicon. Assuming that the Euler angles of the first piezoelectric layer 3A are (0, $\theta1$, 0) and the Euler angles of the second piezoelectric layer 3B are (0, $\theta2$, 0), the characteristics are obtained in the case where the second Euler angle $\theta1$ is changed from about −180° to about 180° when the second Euler angle $\theta2$ is about 120°.

Figure 15A:
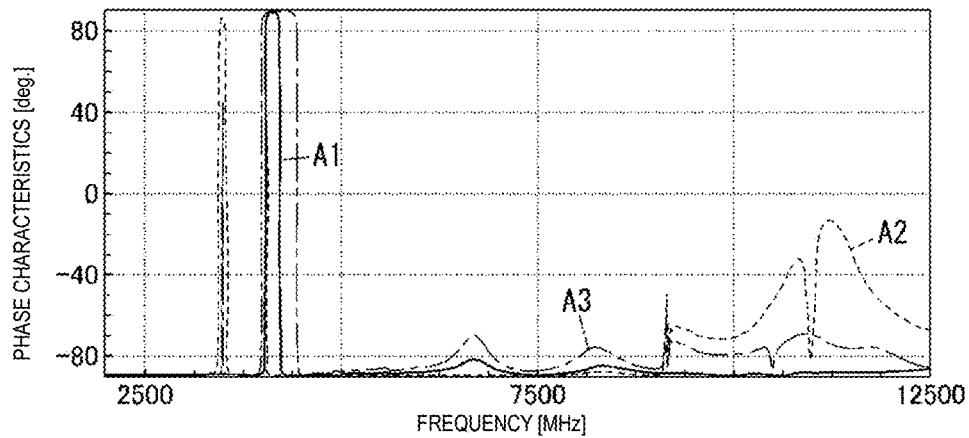
FIG. 15A is a graph illustrating phase characteristics of the acoustic wave device according to Preferred Embodiment 8 of the present invention.
Figure 15B:
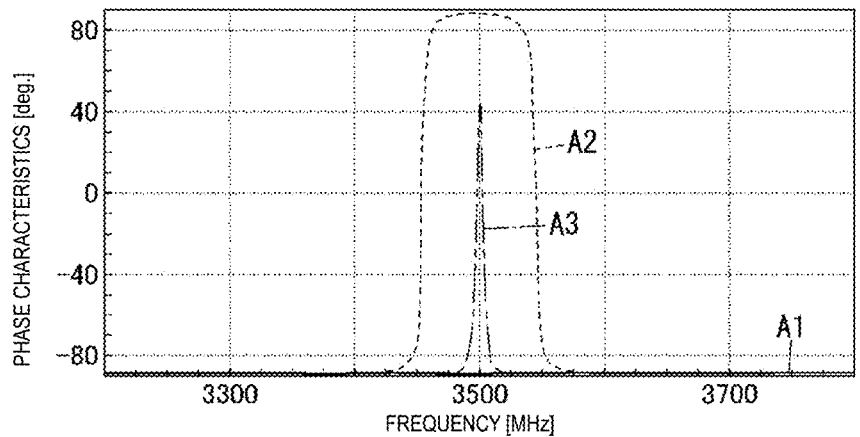
FIG. 15B is a graph illustrating Rayleigh mode phase characteristics of the acoustic wave device according to Preferred Embodiment 8 of the present invention.
Figure 15C:
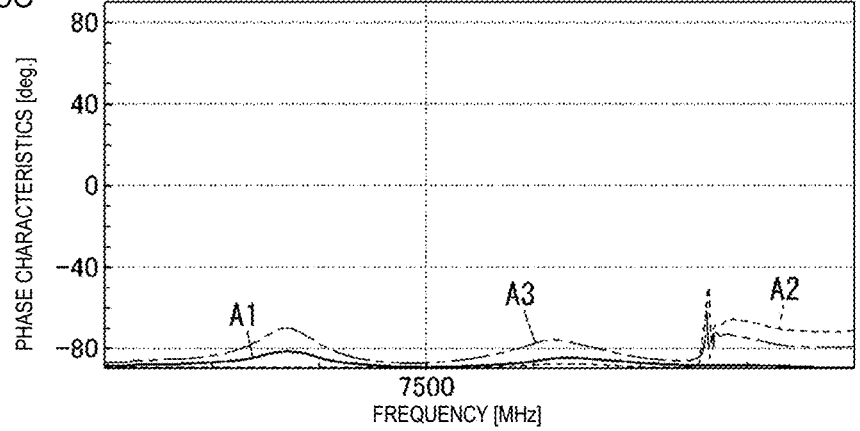
FIG. 15C is a graph illustrating higher-order mode phase characteristics of the acoustic wave device according to Preferred Embodiment 8 of the present invention.

FIGS. 15A to 15C illustrate the phase characteristic A1 of the acoustic wave device 1 according to Preferred Embodiment 8, the phase characteristic A2 of the acoustic wave device of Comparative Example 1, and the phase characteristic A3 of the acoustic wave device of Comparative Example 2. In FIGS. 15A to 15C, the phase characteristic A1 is indicated by a solid line, the phase characteristic A2 is indicated by a broken line, and the phase characteristic A3 is indicated by a dashed dotted line. FIG. 15B is an enlarged view of the low-frequency band (Rayleigh spurious response) in FIGS. 15A and 15C is an enlarged view of the high-frequency band in FIG. 15A.

In the acoustic wave device 1 according to Preferred Embodiment 8, both of the first piezoelectric layer 3A and the second piezoelectric layer 3B are lithium niobate piezoelectric layers. In the acoustic wave device of Comparative Example 1 and the acoustic wave device of Comparative Example 2 as well, both of the first piezoelectric layer and the second piezoelectric layer are lithium niobate piezoelectric layers. Assuming that the Euler angles of the first piezoelectric layer 3A are (0, $\theta1$, 0) and the Euler angles of the second piezoelectric layer 3B are (0, $\theta2$, 0), the phase characteristic A1 in FIGS. 15A to 15C is a phase characteristic in a case where the second Euler angle $\theta1$ is about 40° and the second Euler angle $\theta2$ is about 140° in the acoustic wave device 1 according to Preferred Embodiment 8. The phase characteristic A2 is a phase characteristic in a case where the second Euler angles $\theta1$ and $\theta2$ are about 40° in the acoustic wave device of Comparative Example 1. The phase characteristic A3 is a phase characteristic in a case where the second Euler angles $\theta1$ and $\theta2$ are about 140° in the acoustic wave device of Comparative Example 2.

As illustrated in FIG. 15A, the phase characteristic A1 of the acoustic wave device 1 according to Preferred Embodiment 8 is better than the phase characteristics A2 and A3 of the acoustic wave devices of Comparative Examples 1 and 2 in the frequency bands excluding the frequency band of the main mode.

In particular, as illustrated in FIG. 15B, the acoustic wave device 1 according to Preferred Embodiment 8 can reduce or prevent the spurious response of the Rayleigh mode on the lower frequency side than the frequency band of the main mode, as compared to the acoustic wave devices of Comparative Examples 1 and 2. Meanwhile, as illustrated in FIG. 15A, also in the acoustic wave device 1 according to Preferred Embodiment 8, the characteristics of the main mode are obtained (maintained) to the same or substantially the same extent as those of the acoustic wave devices of Comparative Examples 1 and 2.

Further, as illustrated in FIG. 15C, the acoustic wave device 1 according to Preferred Embodiment 8 can reduce or prevent the spurious response of the higher-order mode on the higher frequency side than the frequency band of the main mode, as compared to the acoustic wave devices of Comparative Examples 1 and 2. As described above, the higher-order mode is a spurious mode that occurs on the higher frequency side than the main mode of the acoustic wave propagating through the first piezoelectric layer 3A and the second piezoelectric layer 3B.

The conditions of the acoustic wave device 1 for obtaining the phase characteristic A1 of FIGS. 15A to 15C are as follows. The thickness of the IDT electrode 6 is about 0.05λ, the thickness of the first piezoelectric layer 3A is about 0.05λ, the thickness of the second piezoelectric layer 3B is about 0.15λ, the thickness of the low acoustic velocity film 4 is about 0.15λ, and the thickness of the high acoustic velocity film 5 is about 0.15λ. The material of the IDT electrode 6 is aluminum, the material of the first piezoelectric layer 3A and the second piezoelectric layer 3B is lithium niobate, the material of the low acoustic velocity film 4 is silicon oxide, the material of the high acoustic velocity film 5 is silicon nitride, and the material of the support substrate 2 is silicon.

(3) Advantageous Effects

Also in the acoustic wave device 1 according to Preferred Embodiment 8, the same as or similar to the acoustic wave device 1 according to Preferred Embodiment 1, in a case where the acoustic wave device 1 is used as a filter, it is possible to reduce or prevent the spurious response of the Rayleigh mode that occurs on the low frequency band side of the pass band of the filter and the spurious response of the higher-order mode that occurs on the high frequency band side of the pass band of the filter.

Preferred Embodiment 9

An acoustic wave device 1 according to Preferred Embodiment 9 of the present invention is different from the acoustic wave device 1 according to Preferred Embodiment 8 in that the thickness of the first piezoelectric layer 3A and the thickness of the second piezoelectric layer 3B are different. Regarding the acoustic wave device 1 according to Preferred Embodiment 9, the same substantially the same elements as those of the acoustic wave device 1 according to Preferred Embodiment 8 are denoted by the same reference numerals, and a description thereof will be omitted.

(1) Configuration

The acoustic wave device 1 according to Preferred Embodiment 9 includes the first piezoelectric layer 3A and the second piezoelectric layer 3B having thicknesses different from each other. The acoustic wave device 1 according to Preferred Embodiment 9 includes the support substrate 2, the low acoustic velocity film 4, the high acoustic velocity film 5, the IDT electrode 6, the two reflectors 7, and the wiring portion 8, the same as or similar to the acoustic wave device 1 according to Preferred Embodiment 8.

In the acoustic wave device 1 according to Preferred Embodiment 9, the first piezoelectric layer 3A is thinner than the second piezoelectric layer 3B. For example, the thickness of the first piezoelectric layer 3A is about 0.05λ, and the thickness of the second piezoelectric layer 3B is about 0.15λ. Note that regarding the first piezoelectric layer 3A and the second piezoelectric layer 3B of Preferred Embodiment 9, description of the same configuration and function as those of the first piezoelectric layer 3A and the second piezoelectric layer 3B of Preferred Embodiment 8 will be omitted.

(2) Characteristics of Acoustic Wave Device

Figure 16:
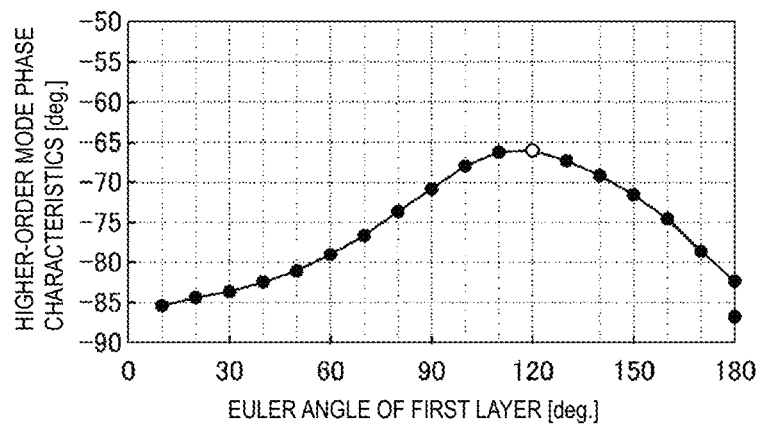
FIG. 16 is a graph illustrating higher-order mode phase characteristics of an acoustic wave device according to Preferred Embodiment 9 of the present invention.

Characteristics of the acoustic wave device 1 according to Preferred Embodiment 9 will be described below with reference to the drawings. In FIG. 16, the "Euler angle of the first layer" is the second Euler angle θ1 of the Euler angles (0, θ1, 0) of the first piezoelectric layer 3A.

In the acoustic wave device 1 according to Preferred Embodiment 9, as illustrated in FIG. 16, in the case where the Euler angles of the first piezoelectric layer 3A are different from the Euler angles of the second piezoelectric layer 3B, higher-order mode phase characteristics can be improved, as compared to the case where the Euler angles of the first piezoelectric layer 3A are the same as the Euler angles of the second piezoelectric layer 3B. In the example of FIG. 16, assuming that the Euler angles of the first piezoelectric layer 3A are (0, θ1, 0) and the Euler angles of the second piezoelectric layer 3B are (0, θ2, 0), the case where the Euler angles of the first piezoelectric layer 3A are the same as the Euler angles of the second piezoelectric layer 3B is the case where the second Euler angles θ1 and θ2 are both about 120°.

Conditions of the acoustic wave device 1 to obtain the phase characteristics of FIG. 16 are as follows. The thickness of the IDT electrode 6 is about 0.05λ, the thickness of the first piezoelectric layer 3A is about 0.05λ, the thickness of the second piezoelectric layer 3B is about 0.15λ, the thickness of the low acoustic velocity film 4 is about 0.15λ, and the thickness of the high acoustic velocity film 5 is about 0.15λ. The material of the IDT electrode 6 is aluminum, the material of the first piezoelectric layer 3A and the second piezoelectric layer 3B is lithium niobate, the material of the low acoustic velocity film 4 is silicon oxide, the material of the high acoustic velocity film 5 is silicon nitride, and the material of the support substrate 2 is silicon. Assuming that the Euler angles of the first piezoelectric layer 3A are (0, θ1, 0) and the Euler angles of the second piezoelectric layer 3B are (0, θ2, 0), the characteristics are obtained in the case where the second Euler angle θ1 is changed from about −180° to about 180° when θ2 is about 120°.

Preferred Embodiment 10

An acoustic wave device 1 according to Preferred Embodiment 10 of the present invention is different from the acoustic wave device 1 according to Preferred Embodiment 8 in that an electromechanical coupling coefficient is, for example, equal to or more than about 4.0% in a case where the first piezoelectric layer 3A and the second piezoelectric layer 3B are made of, for example, lithium niobate. Regarding the acoustic wave device 1 according to Preferred Embodiment 9, the same or substantially the same elements as those of the acoustic wave device 1 according to Preferred Embodiment 8 are denoted by the same reference numerals, and a description thereof will be omitted.

(1) Configuration

In the acoustic wave device 1 according to Preferred Embodiment 10, the Euler angles of the first piezoelectric layer 3A and the Euler angles of the second piezoelectric layer 3B are set such that the electromechanical coupling coefficient is, for example, equal to or more than about 4.0%. The electromechanical coupling coefficient is represented by the following Expression (3). Expression (3) represents an expression in which the electromechanical coupling coefficient is calculated as a percentage. The second Euler angle θ1 satisfies θ1=θ1+180°×n (n=0, ±1, ±2). The thickness of the first piezoelectric layer 3A is denoted by LN1, and the thickness of the second piezoelectric layer 3B is denoted by LN2. Regarding the first piezoelectric layer 3A and the second piezoelectric layer 3B of Preferred Embodiment 9, description of the same or substantially the same configuration and function as those of the first piezoelectric layer 3A and the second piezoelectric layer 3B of Preferred Embodiment 8 will be omitted.

$$
\begin{aligned}
&7.30749421642302 + 0.126467537077711 \times (\theta 1 - 90) + \\
&\quad 1.02330895196759 \times \left(\frac{LN1}{LN2} - 1.44444444433335\right) + \\
&\quad 0.0366048938272421 \times (\theta 2 - 0) + \\
&\quad (-0.00227170614085879) \times \{(\theta 1 - 90) \times (\theta 1 - 90) - 3000\} + \\
&\quad (-0.0000164151797189738) \times \\
&\quad \{(\theta 1 - 90) \times (\theta 1 - 90) \times (\theta 1 - 90) - 0\} + \\
&\quad 0.0000001767839846311 \times \\
&\quad \{(\theta 1 - 90) \times (\theta 1 - 90) \times (\theta 1 - 90) \times (\theta 1 - 90) - 16140000\} + \\
&\quad 0.00527616891343059 \times \{(\theta 2 - 0) \times (\theta 2 - 0) - 11400\} + \\
&\quad 0.0000016737181647348 \times \\
&\quad \{(\theta 2 - 0) \times (\theta 2 - 0) \times (\theta 2 - 0) - 0\} + \\
&\quad (-0.0000000124001733652) \times \\
&\quad \{(\theta 2 - 0) \times (\theta 2 - 0) \times (\theta 2 - 0) \times (\theta 2 - 0) - 233700000\} + \\
&\quad \left(-9.10141229661622 \times 10^{-11}\right) \times \\
&\quad \{(\theta 2 - 0) \times (\theta 2 - 0) \times (\theta 2 - 0) \times (\theta 2 - 0) \times (\theta 2 - 0) - 0\} + \\
&\quad 0.0159877881713206 \times (\theta 1 - 90) \times \\
&\quad \left(\frac{LN1}{LN2} - 1.44444444433335\right) + \\
&\quad 0.00022852665674879 \times (\theta 1 - 90) \times (\theta 2 - 0) + \\
&\quad (-0.00673513735675292) \times \\
&\quad \left(\frac{LN1}{LN2} - 1.44444444433335\right) \times (\theta 2 - 0)
\end{aligned}
$$

Expression (3)

(2) Characteristics of Acoustic Wave Device

Figure 17A:
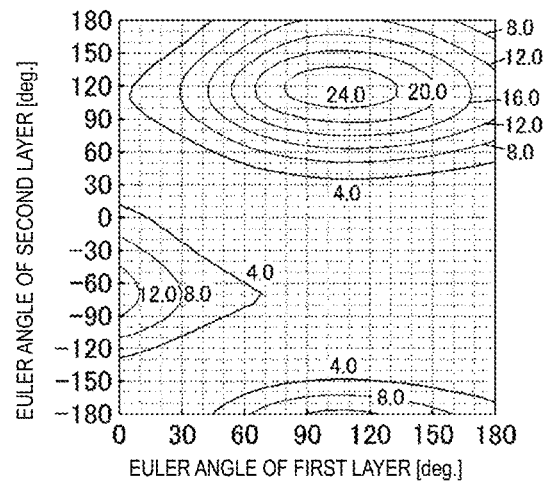
FIGS. 17A to 17C are contour drawings illustrating characteristics of the electromechanical coupling coefficient in an acoustic wave device according to Preferred Embodiment 10 of the present invention.
Figure 17B:
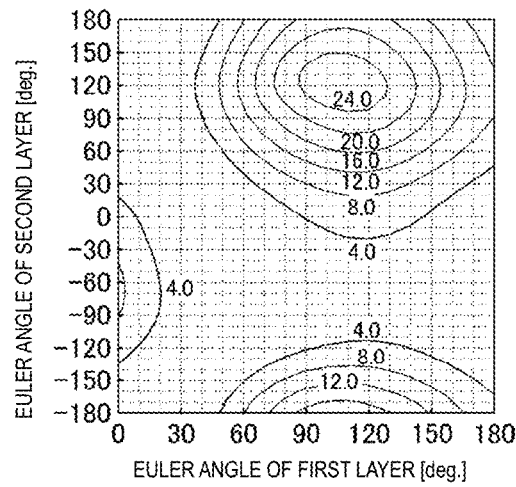
Figure 17C:
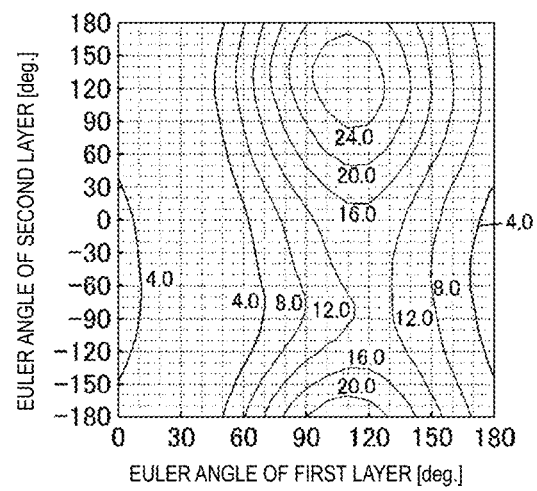

FIGS. 17A to 17C illustrate characteristics of the electromechanical coupling coefficient when a ratio (LN1/LN2) of the thickness LN1 of the first piezoelectric layer 3A to the thickness LN2 of the second piezoelectric layer 3B is changed. In each of FIGS. 17A to 17C, the "Euler angle of the first layer" is the second Euler angle θ1 of the Euler angles (0, θ1, 0) of the first piezoelectric layer 3A, and the "Euler angle of the second layer" is the second Euler angle θ2 of the Euler angles (0, θ2, 0) of the second piezoelectric layer 3B. The conditions of the acoustic wave device 1 for obtaining the characteristics of the electromechanical coupling coefficient of FIGS. 17A to 17C are as follows. The thickness of the IDT electrode 6 is about 0.05λ, the thickness of the low acoustic velocity film 4 is about 0.15λ, and the thickness of the high acoustic velocity film 5 is about 0.15λ. The material of the IDT electrode 6 is aluminum, the material of the low acoustic velocity film 4 is silicon oxide, the material of the high acoustic velocity film 5 is silicon nitride, and the material of the support substrate 2 is silicon.

FIG. 17A illustrates characteristics of the electromechanical coupling coefficient in a case where the ratio (LN1/LN2) is about 0.33. Good characteristics can be obtained by selecting a combination of the second Euler angles θ1 and θ2 such that the electromechanical coupling coefficient is equal to or more than about 4.0%.

FIG. 17B illustrates characteristics of the electromechanical coupling coefficient in a case where the ratio (LN1/LN2) is 1. As in the case where the ratio (LN1/LN2) is about 0.33, good characteristics can be obtained by selecting a combination of the second Euler angles θ1 and θ2 such that the electromechanical coupling coefficient is equal to or more than about 4.0%.

FIG. 17C illustrates characteristics of the electromechanical coupling coefficient in a case where the ratio (LN1/LN2) is 3. As in the case where the ratio (LN1/LN2) is about 0.33, good characteristics can be obtained by selecting a combination of the second Euler angles θ1 and θ2 such that the electromechanical coupling coefficient is equal to or more than about 4.0%.

(3) Advantageous Effects

In the acoustic wave device 1 according to Preferred Embodiment 10, the electromechanical coupling coefficient is, for example, equal to or more than about 4.0%. This makes it possible to efficiently excite a mode in which an SH wave is a main component. As described above, Expression (3) represents an expression in which the electromechanical coupling coefficient is calculated as a percentage. Therefore, the second Euler angle θ1 and the second Euler angle θ2 are values such that the electromechanical coupling coefficient represented by Expression (3) is, for example, equal to or more than about 4.0%.

The preferred embodiments and modifications of the present invention described above are merely some of the various preferred embodiments and modifications of the present invention. In addition, various changes can be made to the preferred embodiments and the modifications according to design or the like as long as the advantageous effects of the present invention can be achieved.

Aspect

The following aspects are disclosed herein.

An acoustic wave device (1; 1a; 1b; 1c) according to a preferred embodiment of the present invention includes a support substrate (2), a first piezoelectric layer (3A), a second piezoelectric layer (3B), and an IDT electrode (6). The first piezoelectric layer (3A) and the second piezoelectric layer (3B) are provided on the support substrate (2). The IDT electrode (6) is provided on the first piezoelectric layer (3A) and includes a plurality of electrode fingers (63). The second piezoelectric layer (3B) is provided between the first piezoelectric layer (3A) and the support substrate (2). Both the first piezoelectric layer (3A) and the second piezoelectric layer (3B) are made of lithium tantalate or lithium niobate. Euler angles of the second piezoelectric layer (3B) are different from Euler angles of the first piezoelectric layer (3A).

With the above-described acoustic wave device (1; 1a; 1b; 1c), it is possible to reduce or prevent a spurious response of a Rayleigh mode that occurs in a band on a lower frequency side than an excitation mode used for obtaining characteristics and a spurious response of a higher-order mode that occurs in a band on a higher frequency side than the above-described excitation mode. Further, in a case where the above-described acoustic wave device (1; 1a; 1b; 1c) is used as a filter, it is possible to reduce or prevent the spurious response of the Rayleigh mode that occurs on a low frequency band side of a pass band of the filter and the spurious response of the higher-order mode that occurs on a high frequency band side of the pass band of the filter.

In an acoustic wave device (1; 1a; 1b; 1c) according to a preferred embodiment of the present invention, at least one of the first piezoelectric layer (3A) and the second piezoelectric layer (3B) is of a rotated Y-cut.

In the above-described acoustic wave device (1; 1a; 1b; 1c, at least one of the first piezoelectric layer (3A) and the second piezoelectric layer (3B) is of the rotated Y-cut. Since an SH wave is easily excited in the rotated Y-cut, a coupling coefficient of the SH wave can be easily increased.

In an acoustic wave device (1; 1a; 1b; 1c) according to a preferred embodiment of the present invention, both of the first piezoelectric layer (3A) and the second piezoelectric layer (3B) are of a rotated Y-cut.

In the above-described acoustic wave device (1; 1a; 1b; 1c), both of the first piezoelectric layer (3A) and the second piezoelectric layer (3B) are of a rotated Y-cut. Since the SH wave is easily excited in the rotated Y-cut, it is easy to further increase the coupling coefficient of the SH wave.

In an acoustic wave device (1; 1a; 1b; 1c) according to a preferred embodiment of the present invention, the first piezoelectric layer (3A) and the second piezoelectric layer (3B) are made of lithium tantalate. When the thickness of the first piezoelectric layer (3A) is denoted by LT1, the thickness of the second piezoelectric layer (3B) is denoted by LT2, the second Euler angle of the first piezoelectric layer (3A) is denoted by θ1, and the second Euler angle of the second piezoelectric layer (3B) is denoted by θ2, an electromechanical coupling coefficient satisfies Expression (1). The second Euler angle θ1 and the second Euler angle θ2 are values such that the electromechanical coupling coefficient is equal to or more than about 4.0%.

Expression (1)

$3.00330520967856 +$ $0.346620517082123 \times \left(\frac{LT1}{LT2} - 1.44444444433334\right) +$ $0.0570057523277407 \times (\theta1 - 85.5) +$ $0.0124323016193303 \times (\theta2 - 0) +$ $(-0.00066220403802972) \times$ $\{(\theta1 - 85.5) \times (\theta1 - 85.5) - 3234.75\} +$ $(-0.0000074522275643441) \times$ $\{(\theta1 - 85.5) \times (\theta1 - 85.5) \times (\theta1 - 85.5) - 7310.25\} +$ $0.0000000527344575735 \times \{(\theta1 - 85.5) \times (\theta1 - 85.5) \times$ $(\theta1 - 85.5) \times (\theta1 - 85.5) - 18351652.3125\} +$ $0.000224701682752685 \times \{(\theta2 - 0) \times (\theta2 - 0) - 11400\} +$ $0.0000009558742707317 \times$ $\{(\theta2 - 0) \times (\theta2 - 0) \times (\theta2 - 0) - 0\} +$ $(-0.0000000059893558361) \times$ $\{(\theta2 - 0) \times (\theta2 - 0) \times (\theta2 - 0) \times (\theta2 - 0) - 233700000\} +$ $(-4.32597449093616e^{-11} \times$ $\{(\theta2 - 0) \times (\theta2 - 0) \times (\theta2 - 0) \times (\theta2 - 0) \times (\theta2 - 0) - 0\}$ In the above-described acoustic wave device (1; 1a; 1b; 1c), the electromechanical coupling coefficient is equal to or more than about 4.0%. This makes it possible to efficiently excite the mode in which the SH wave is the main component.

In an acoustic wave device (1; 1a; 1b; 1c) according to a preferred embodiment of the present invention, the first piezoelectric layer (3A) and the second piezoelectric layer (3B) are made of lithium tantalate. When the thickness of the first piezoelectric layer (3A) is denoted by LT1, the thickness of the second piezoelectric layer (3B) is denoted by LT2, the second Euler angle of the first piezoelectric layer (3A) is denoted by θ1, and the second Euler angle of the second piezoelectric layer (3B) is denoted by θ2, a TCF satisfies Expression (2). The second Euler angle θ1 and the second Euler angle θ2 are such values that the absolute value of the TCF is in the range of equal to or less than about 10 ppm/° C.

Expression (2)

$-3.29013891692386 +$ $0.829996307633191 \times \left(\frac{LT1}{LT2} - 1.44444444433334\right) +$ $0.483995654864519 \times (\theta1 - 85.5) +$ $(-0.194567821179747) \times (\theta2 - 0) +$ $0.000179452385587509 \times$ $\{(\theta1 - 85.5) \times (\theta1 - 85.5) - 3234.75\} +$ $(-0.0000974537560393475) \times$ $\{(\theta1 - 85.5) \times (\theta1 - 85.5) \times (\theta1 - 85.5) - 7310.25\} +$ $(-0.0000000192594958352) \times \{(\theta1 - 85.5) \times (\theta1 - 85.5) \times$ $(\theta1 - 85.5) \times (\theta1 - 85.5) - 18351652.3125\} +$ $0.0000000046470081457 \times \{(\theta1 - 85.5) \times (\theta1 - 85.5) \times$ $(\theta1 - 85.5) \times (\theta1 - 85.5) \times (\theta1 - 85.5) - 119136362.625\} +$ $(-0.000422585955937192) \times \{(\theta2 - 0) \times (\theta2 - 0) - 11400\} +$ $0.0000232656788288669 \times$ $\{(\theta2 - 0) \times (\theta2 - 0) \times (\theta2 - 0) - 0\} +$ $0.0000000132633840535 \times$ $\{(\theta2 - 0) \times (\theta2 - 0) \times (\theta2 - 0) \times (\theta2 - 0) - 233700000\} +$ $(-0.0000000005476321966) \times$ $\{(\theta2 - 0) \times (\theta2 - 0) \times (\theta2 - 0) \times (\theta2 - 0) \times (\theta2 - 0) - 0\} +$ $0.0224071239542036 \times$ $\left(\frac{LT1}{LT2} - 1.44444444433334\right) \times (\theta1 - 85.5) +$ $(-0.000253262537154296) \times \{(\theta1 - 85.5) \times (\theta2 - 0)\}$ In the above-described acoustic wave device (1; 1a; 1b; 1c), the absolute value of the TCF is in the range of equal to or less than about 10 ppm/° C. As such, a good TCF can be achieved.

In an acoustic wave device (1; 1a; 1b; 1c) according to a preferred embodiment of the present invention, the first piezoelectric layer (3A) and the second piezoelectric layer (3B) are made of lithium niobate. When the thickness of the first piezoelectric layer (3A) is denoted by LN1, the thickness of the second piezoelectric layer (3B) is denoted by LN2, the second Euler angle of the first piezoelectric layer (3A) is denoted by θ1, and the second Euler angle of the second piezoelectric layer (3B) is denoted by θ2, the electromechanical coupling coefficient satisfies Expression (3). The second Euler angle θ1 and the second Euler angle θ2 are values such that the electromechanical coupling coefficient is equal to or more than about 4.0%.

$$\begin{aligned}
&7.30749421642302 + 0.126467537077711 \times (\theta1 - 90) + \\
&\quad 1.02330895196759 \times \left(\frac{LN1}{LN2} - 1.44444444433335\right) + \\
&\quad 0.0366048938272421 \times (\theta2 - 0) + \\
&\quad (-0.00227170614085879) \times \{(\theta1 - 90) \times (\theta1 - 90) - 3000\} + \\
&\quad (-0.0000164151797189738) \times \\
&\quad \{(\theta1 - 90) \times (\theta1 - 90) \times (\theta1 - 90) - 0\} + \\
&\quad 0.0000001767839846311 \times \\
&\quad \{(\theta1 - 90) \times (\theta1 - 90) \times (\theta1 - 90) \times (\theta1 - 90) - 16140000\} + \\
&\quad 0.00527616891343059 \times \{(\theta2 - 0) \times (\theta2 - 0) - 11400\} + \\
&\quad 0.0000016737181647348 \times \\
&\quad \{(\theta2 - 0) \times (\theta2 - 0) \times (\theta2 - 0) - 0\} + \\
&\quad (-0.0000000124001733652) \times \\
&\quad \{(\theta2 - 0) \times (\theta2 - 0) \times (\theta2 - 0) \times (\theta2 - 0) - 233700000\} + \\
&\quad (-9.10141229661622e^{-11}) \times \\
&\quad \{(\theta2 - 0) \times (\theta2 - 0) \times (\theta2 - 0) \times (\theta2 - 0) \times (\theta2 - 0) - 0\} + \\
&\quad 0.0159877881713206 \times (\theta1 - 90) \times \\
&\quad \left(\frac{LN1}{LN2} - 1.44444444433335\right) + \\
&\quad 0.00022852665674879 \times (\theta1 - 90) \times (\theta2 - 0) + \\
&\quad (-0.00673513735675292) \times \\
&\quad \left(\frac{LN1}{LN2} - 1.44444444433335\right) \times (\theta2 - 0)
\end{aligned}$$

Expression (3)

In the above-described acoustic wave device (1; 1*a*; 1*b*; 1*c*), the electromechanical coupling coefficient is equal to or more than about 4.0%. This makes it possible to efficiently excite a mode in which the SH wave is a main component.

In an acoustic wave device (1; 1*a*; 1*b*; 1*c*) according to a preferred embodiment of the present invention, a ratio of the thickness of the second piezoelectric layer (3A) to the thickness of the first piezoelectric layer (3B) is equal to or more than about 1/10 and equal to or less than about 10.

In the above-described acoustic wave device (1; 1*a*; 1*b*; 1*c*), the ratio of the thickness of the second piezoelectric layer (3B) to the thickness of the first piezoelectric layer (3A) is equal to or more than about 1/10 and equal to or less than about 10. With the above ratio, the advantageous effect of reducing or preventing the spurious response is large.

An acoustic wave device (1; 1*a*; 1*c*) according to a preferred embodiment of the present invention further includes a low acoustic velocity film (4). In the low acoustic velocity film (4), the acoustic velocity of a bulk wave propagating through the low acoustic velocity film (4) is lower than the acoustic velocity of a bulk wave propagating through the first piezoelectric layer (3A) and the second piezoelectric layer (3B). The low acoustic velocity film (4) is provided between the support substrate (2) and the second piezoelectric layer (3B).

In the above-described acoustic wave device (1; 1*a*; 1*c*), the low acoustic velocity film (4) is provided between the support substrate (2) and the second piezoelectric layer (3B) in a thickness direction (first direction D1) of the support substrate (2). With this, it is possible to improve a Q factor of the acoustic wave device (1; 1*a*; 1*c*).

An acoustic wave device (1; 1*c*) according to a preferred embodiment of the present invention further includes a high acoustic velocity film (5). In the high acoustic velocity film (5), the acoustic velocity of a bulk wave propagating through the high acoustic velocity film (5) is higher than the acoustic velocity of an acoustic wave propagating through the first piezoelectric layer (3A) and the second piezoelectric layer (3B). The high acoustic velocity film (5) is provided between the support substrate (2) and the low acoustic velocity film (4).

In the above-described acoustic wave device (1; 1*c*), the high acoustic velocity film (5) is provided between the support substrate (2) and the low acoustic velocity film (4) in the thickness direction (first direction D1) of the support substrate (2). With this, the Q factor of the acoustic wave device (1; 1*c*) can be further improved.

In an acoustic wave device (1; 1*c*) according to a preferred embodiment of the present invention, the material of the high acoustic velocity film (5) is silicon nitride.

In an acoustic wave device (1*a*) according to a preferred embodiment of the present invention, the support substrate (2) is a high acoustic velocity support substrate. The acoustic velocity of a bulk wave propagating through the high acoustic velocity support substrate is higher than the acoustic velocity of an acoustic wave propagating through the first piezoelectric layer (3A) and the second piezoelectric layer (3B).

In the above-described acoustic wave device (1*a*), the support substrate (2) is a high acoustic velocity support substrate. As such, the Q factor of the acoustic wave device (1*a*) can be further improved.

In an acoustic wave device (1*a*; 1*b*) according to a preferred embodiment of the present invention, a material of the low acoustic velocity film (4) is silicon oxide.

In an acoustic wave device (1; 1*a*; 1*b*; 1*c*) according to a preferred embodiment of the present invention, a material of the support substrate (2) is silicon.

An acoustic wave device (1*c*) according to a preferred embodiment of the present invention further includes a silicon oxide layer (3C). The silicon oxide layer (3C) is provided between the first piezoelectric layer (3A) and the second piezoelectric layer (3B).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a support substrate;
   a first piezoelectric layer and a second piezoelectric layer on the support substrate; and
   an IDT electrode on the first piezoelectric layer and including a plurality of electrode fingers; wherein
   the second piezoelectric layer is between the first piezoelectric layer and the support substrate;
   Euler angles of the second piezoelectric layer are different from Euler angles of the first piezoelectric layer;
   the first piezoelectric layer and the second piezoelectric layer are made of lithium tantalate;
   when a thickness of the first piezoelectric layer is denoted by LT1, a thickness of the second piezoelectric layer is denoted by LT2, a second Euler angle of the first piezoelectric layer is denoted by θ1, and a second Euler angle of the second piezoelectric layer is denoted by θ2, an electromechanical coupling coefficient satisfies Expression 1;

each of the second Euler angle θ1 and the second Euler angle θ2 is greater than or equal to about −180° and less than or equal to about 180°; and the second Euler angle θ1 and the second Euler angle θ2 are values such that the electromechanical coupling coefficient is equal to or more than about 4.0%:

the electromechanical coupling coefficient=

$$3.00330520967856 + \\
0.346620517082123 \times \left(\frac{LT1}{LT2} - 1.44444444433334\right) + \\
0.0570057523277407 \times (\theta 1 - 85.5) + \\
0.0124323016193303 \times (\theta 2 - 0) + (-0.00066220403802972) \times \\
\{(\theta 1 - 85.5) \times (\theta 1 - 85.5) - 3234.75\} + \\
(-0.0000074522275643441) \times \\
\{(\theta 1 - 85.5) \times (\theta 1 - 85.5) \times (\theta 1 - 85.5) - 7310.25\} + \\
0.0000000527344575735 \times \{(\theta 1 - 85.5) \times (\theta 1 - 85.5) \times \\
(\theta 1 - 85.5) \times (\theta 1 - 85.5) - 18351652.3125\} + \\
0.000224701682752685 \times \{(\theta 2 - 0) \times (\theta 2 - 0) - 11400\} + \\
0.0000009558742707317 \times \\
\{(\theta 2 - 0) \times (\theta 2 - 0) \times (\theta 2 - 0) - 0\} + \\
(-0.0000000059893558361) \times \\
\{(\theta 2 - 0) \times (\theta 2 - 0) \times (\theta 2 - 0) \times (\theta 2 - 0) - 233700000\} + \\
\left(-4.32597449093616 \times 10^{-11}\right) \times \\
\{(\theta 2 - 0) \times (\theta 2 - 0) \times (\theta 2 - 0) \times (\theta 2 - 0) \times (\theta 2 - 0) - 0\}. \quad \text{Expression 1}$$

2. The acoustic wave device according to claim 1, wherein at least one of the first piezoelectric layer and the second piezoelectric layer is of a rotated Y-cut.

3. The acoustic wave device according to claim 2, wherein both of the first piezoelectric layer and the second piezoelectric layer are of a rotated Y-cut.

4. The acoustic wave device according to claim 1, wherein a ratio of a thickness of the second piezoelectric layer to a thickness of the first piezoelectric layer is equal to or more than about 1/10 and equal to or less than about 10.

5. The acoustic wave device according to claim 1, further comprising:
   a low acoustic velocity film in which an acoustic velocity of a bulk wave propagating through the low acoustic velocity film is lower than an acoustic velocity of a bulk wave propagating through the first piezoelectric layer and the second piezoelectric layer; wherein
   the low acoustic velocity film is between the support substrate and the second piezoelectric layer.

6. The acoustic wave device according to claim 5, further comprising:
   a high acoustic velocity film in which an acoustic velocity of a bulk wave propagating through the high acoustic velocity film is higher than an acoustic velocity of an acoustic wave propagating through the first piezoelectric layer and the second piezoelectric layer; wherein
   the high acoustic velocity film is between the support substrate and the low acoustic velocity film.

7. The acoustic wave device according to claim 6, wherein a material of the high acoustic velocity film is silicon nitride.

8. The acoustic wave device according to claim 5, wherein the support substrate is a high acoustic velocity support substrate in which an acoustic velocity of a bulk wave propagating through the high acoustic velocity support substrate is higher than an acoustic velocity of an acoustic wave propagating through the first piezoelectric layer and the second piezoelectric layer.

9. The acoustic wave device according to claim 5, wherein a material of the low acoustic velocity film is silicon oxide.

10. The acoustic wave device according to claim 1, wherein a material of the support substrate is silicon.

11. The acoustic wave device according to claim 1, further comprising a silicon oxide layer between the first piezoelectric layer and the second piezoelectric layer.

12. An acoustic wave device comprising:
   a support substrate;
   a first piezoelectric layer and a second piezoelectric layer on the support substrate; and
   an IDT electrode on the first piezoelectric layer and including a plurality of electrode fingers; wherein
   the second piezoelectric layer is between the first piezoelectric layer and the support substrate;
   Euler angles of the second piezoelectric layer are different from Euler angles of the first piezoelectric layer;
   the first piezoelectric layer and the second piezoelectric layer are made of lithium tantalate;
   when a thickness of the first piezoelectric layer is denoted by LT1, a thickness of the second piezoelectric layer is denoted by LT2, a second Euler angle of the first piezoelectric layer is denoted by θ1, and a second Euler angle of the second piezoelectric layer is denoted by θ2, a TCF satisfies Expression 2;
   each of the second Euler angle θ1 and the second Euler angle θ2 is greater than or equal to about −180° and less than or equal to about 180°; and
   the second Euler angle θ1 and the second Euler angle θ2 are values such that an absolute value of the TCF is in a range of equal to or less than about 10 ppm/° C.:

the TCF=

$$-3.29013891692386 + \\
0.829996307633191 \times \left(\frac{LT1}{LT2} - 1.44444444433334\right) + \\
0.483995654864519 \times (\theta 1 - 85.5) + \\
(-0.194567821179747) \times (\theta 2 - 0) + 0.000179452385587509 \times \\
\{(\theta 1 - 85.5) \times (\theta 1 - 85.5) - 3234.75\} + \\
(-0.0000974537560393475) \times \\
\{(\theta 1 - 85.5) \times (\theta 1 - 85.5) \times (\theta 1 - 85.5) - 7310.25\} + \\
(-0.0000000192594958352) \times \{(\theta 1 - 85.5) \times \\
(\theta 1 - 85.5) \times (\theta 1 - 85.5) \times (\theta 1 - 85.5) - 18351652.3125\} + \\
0.0000000046470081457 \times \{(\theta 1 - 85.5) \times (\theta 1 - 85.5) \times \\
(\theta 1 - 85.5) \times (\theta 1 - 85.5) \times (\theta 1 - 85.5) - 119136362.625\} + \\
(-0.000422585955937192) \times \{(\theta 2 - 0) \times (\theta 2 - 0) - 11400\} + \\
0.0000232656788288669 \times \\
\{(\theta 2 - 0) \times (\theta 2 - 0) \times (\theta 2 - 0) - 0\} + \\
0.0000000132633840535 \times \\
\{(\theta 2 - 0) \times (\theta 2 - 0) \times (\theta 2 - 0) \times (\theta 2 - 0) - 233700000\} + \\
(-0.0000000005476321966) \times \quad \text{Expression 2}$$

-continued $$\{(\theta2-0)\times(\theta2-0)\times(\theta2-0)\times(\theta2-0)\times(\theta2-0)-0\}+$$

$$0.0224071239542036\times$$

$$\left(\frac{LT1}{LT2}-1.44444444433334\right)\times(\theta1-85.5)+$$

$$(-0.000253262537154296)\times(\theta1-85.5)\times(\theta2-0).$$

13. An acoustic wave device comprising:
a support substrate;
a first piezoelectric layer and a second piezoelectric layer on the support substrate; and
an IDT electrode on the first piezoelectric layer and including a plurality of electrode fingers; wherein
the second piezoelectric layer is between the first piezoelectric layer and the support substrate;
Euler angles of the second piezoelectric layer are different from Euler angles of the first piezoelectric layer;
the first piezoelectric layer and the second piezoelectric layer are made of lithium niobate;
when a thickness of the first piezoelectric layer is denoted by LN1, a thickness of the second piezoelectric layer is denoted by LN2, a second Euler angle of the first piezoelectric layer is denoted by $\theta1$, and a second Euler angle of the second piezoelectric layer is denoted by $\theta2$, an electromechanical coupling coefficient satisfies Expression 3;
each of the second Euler angle $\theta1$ and the second Euler angle $\theta2$ is greater than or equal to about $-180°$ and less than or equal to about $180°$; and
the second Euler angle $\theta1$ and the second Euler angle $\theta2$ are values such that the electromechanical coupling coefficient is equal to or more than about 4.0%:
the electromechanical coupling coefficient=

Expression 3

$$7.30749421642302+0.126467527077711\times(\theta1-90)+$$

$$1.02330895196759\times\left(\frac{LN1}{LN2}-1.44444444433335\right)+$$

$$0.0366048938272421\times(\theta2-0)+$$

$$(-0.00227170614085879)\times\{(\theta1-90)\times(\theta1-90)-3000\}+$$

$$(-0.0000164151797189738)\times$$

$$\{(\theta1-90)\times(\theta1-90)\times(\theta1-90)-0\}+$$

$$0.0000001767839846311\times$$

$$\{(\theta1-90)\times(\theta1-90)\times(\theta1-90)\times(\theta1-90)-16140000\}+$$

$$0.00527616891343059\times\{(\theta2-0)\times(\theta2-0)-11400\}+$$

$$0.0000016737181647348\times$$

$$\{(\theta2-0)\times(\theta2-0)\times(\theta2-0)-0\}+$$

$$(-0.0000000124001733652)\times$$

$$\{(\theta2-0)\times(\theta2-0)\times(\theta2-0)\times(\theta2-0)-233700000\}+$$

$$\left(-9.10141229661622\times10^{-11}\right)\times$$

$$\{(\theta2-0)\times(\theta2-0)\times(\theta2-0)\times(\theta2-0)\times(\theta2-0)-0\}+$$

$$0.0159877881713206\times(\theta1-90)\times$$

$$\left(\frac{LN1}{LN2}-1.44444444433335\right)+0.00022852665674879\times$$

$$(\theta1-90)\times(\theta2-0)+(-0.00673513735675292)\times$$

$$\left(\frac{LN1}{LN2}-1.44444444433335\right)\times(\theta2-0).$$

* * * * *